United States Patent
Suzuki et al.

(10) Patent No.: US 10,690,755 B2
(45) Date of Patent: Jun. 23, 2020

(54) SOLID-STATE IMAGING DEVICE HAVING INCREASED DISTANCE MEASUREMENT ACCURACY AND INCREASED DISTANCE MEASUREMENT RANGE

(71) Applicant: PANASONIC INTELLECTUAL PROPERTY MANAGEMENT CO., LTD., Osaka (JP)

(72) Inventors: Sei Suzuki, Osaka (JP); Tohru Yamada, Kyoto (JP); Yasuyuki Shimizu, Kyoto (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/883,938

(22) Filed: Jan. 30, 2018

(65) Prior Publication Data

US 2018/0156898 A1 Jun. 7, 2018

Related U.S. Application Data

(63) Continuation of application No. PCT/JP2016/003495, filed on Jul. 28, 2016.

(30) Foreign Application Priority Data

Aug. 4, 2015 (JP) .................................. 2015-154591

(51) Int. Cl.
*G01S 7/486* (2020.01)
*H04N 5/374* (2011.01)
(Continued)

(52) U.S. Cl.
CPC ............ *G01S 7/4865* (2013.01); *G01S 7/481* (2013.01); *G01S 7/4816* (2013.01);
(Continued)

(58) Field of Classification Search
CPC .... G01S 7/4865; G01S 7/4863; G01S 7/4816; G01S 17/023; G01S 7/481; G01S 17/89; H04N 5/37452; H04N 5/347; H04N 5/3696; H04N 5/374; H04N 5/369; H04N 5/353; H01L 27/14601; H01L 27/146
See application file for complete search history.

(56) References Cited

U.S. PATENT DOCUMENTS 7,843,029 B2* 11/2010 Kawahito ................ G01C 3/02
257/431
8,179,463 B1 5/2012 Geurts
(Continued)

FOREIGN PATENT DOCUMENTS

JP 2004-294420 A 10/2004
JP 2009-021316 A 1/2009
(Continued)

OTHER PUBLICATIONS

International Search Report and Written Opinion issued in International Patent Application No. PCT/JP2016/003495, dated Oct. 25, 2016; with partial English translation.
(Continued)

*Primary Examiner* — Padma Haliyur
(74) *Attorney, Agent, or Firm* — McDermott Will & Emery LLP

(57) ABSTRACT

A plurality of pixels of a solid-state imaging device include: a photoelectric converter which receives light from an object and converts the light into charge; a plurality of readers which read the charge from the photoelectric converter; a plurality of charge accumulators which accumulate the charge of the photoelectric converter; and a transfer controller which performs a transfer control including controlling whether the charge is transferred or blocked from being transferred. The readers read the charge of the photoelectric converter to the charge accumulators, the plurality of pixels include at least a first pixel and a second pixel, and the transfer controller performs the transfer control to cause addition of the charge read from each of the first pixel and the second pixel.

3 Claims, 25 Drawing Sheets

(51) Int. Cl.
| | |
|---|---|
| *G01S 7/4865* | (2020.01) |
| *H01L 27/146* | (2006.01) |
| *H04N 5/353* | (2011.01) |
| *H04N 5/369* | (2011.01) |
| *G01S 17/89* | (2020.01) |
| *G01S 7/481* | (2006.01) |
| *H04N 5/347* | (2011.01) |
| *H04N 5/3745* | (2011.01) |
| *G01S 7/4863* | (2020.01) |
| *G01S 17/86* | (2020.01) |

(52) U.S. Cl.
CPC ............ *G01S 7/4863* (2013.01); *G01S 17/86* (2020.01); *G01S 17/89* (2013.01); *H01L 27/146* (2013.01); *H01L 27/14601* (2013.01); *H04N 5/347* (2013.01); *H04N 5/353* (2013.01); *H04N 5/369* (2013.01); *H04N 5/3696* (2013.01); *H04N 5/374* (2013.01); *H04N 5/37452* (2013.01)

(56) References Cited

U.S. PATENT DOCUMENTS

| | | | |
|---|---|---|---|
| 8,570,412 B2 * | 10/2013 | Yanagita | H01L 27/14603 348/301 |
| 2006/0192938 A1 | 8/2006 | Kawahito | |
| 2009/0057673 A1 | 3/2009 | Ichikawa et al. | |
| 2010/0231774 A1 | 9/2010 | Tashiro | |
| 2011/0273561 A1 | 11/2011 | Oggier et al. | |
| 2012/0154597 A1 | 6/2012 | Wilson et al. | |
| 2012/0248514 A1 | 10/2012 | Korekado et al. | |
| 2013/0021441 A1 | 1/2013 | Kim | |
| 2015/0092019 A1 * | 4/2015 | Asano | G01C 3/085 348/46 |
| 2016/0259057 A1 | 9/2016 | Ito | |

FOREIGN PATENT DOCUMENTS

| | | |
|---|---|---|
| JP | 2010-213231 A | 9/2010 |
| JP | 2012-217059 A | 11/2012 |
| WO | 2011/036041 A1 | 3/2011 |
| WO | 2015/075926 A1 | 5/2015 |

OTHER PUBLICATIONS

Extended European Search Report issued in European Application No. 16832503.3 dated May 4, 2018.

Office Action dated Apr. 28, 2020 issued in corresponding Japanese Patent Application No. 2017-532371; with English translation.

* cited by examiner

☐ DISTANCE CALCULATION RANGE

● POSITION OF CENTER OF GRAVITY AFTER DISTANCE CALCULATION

☐ FD SHARED RANGE

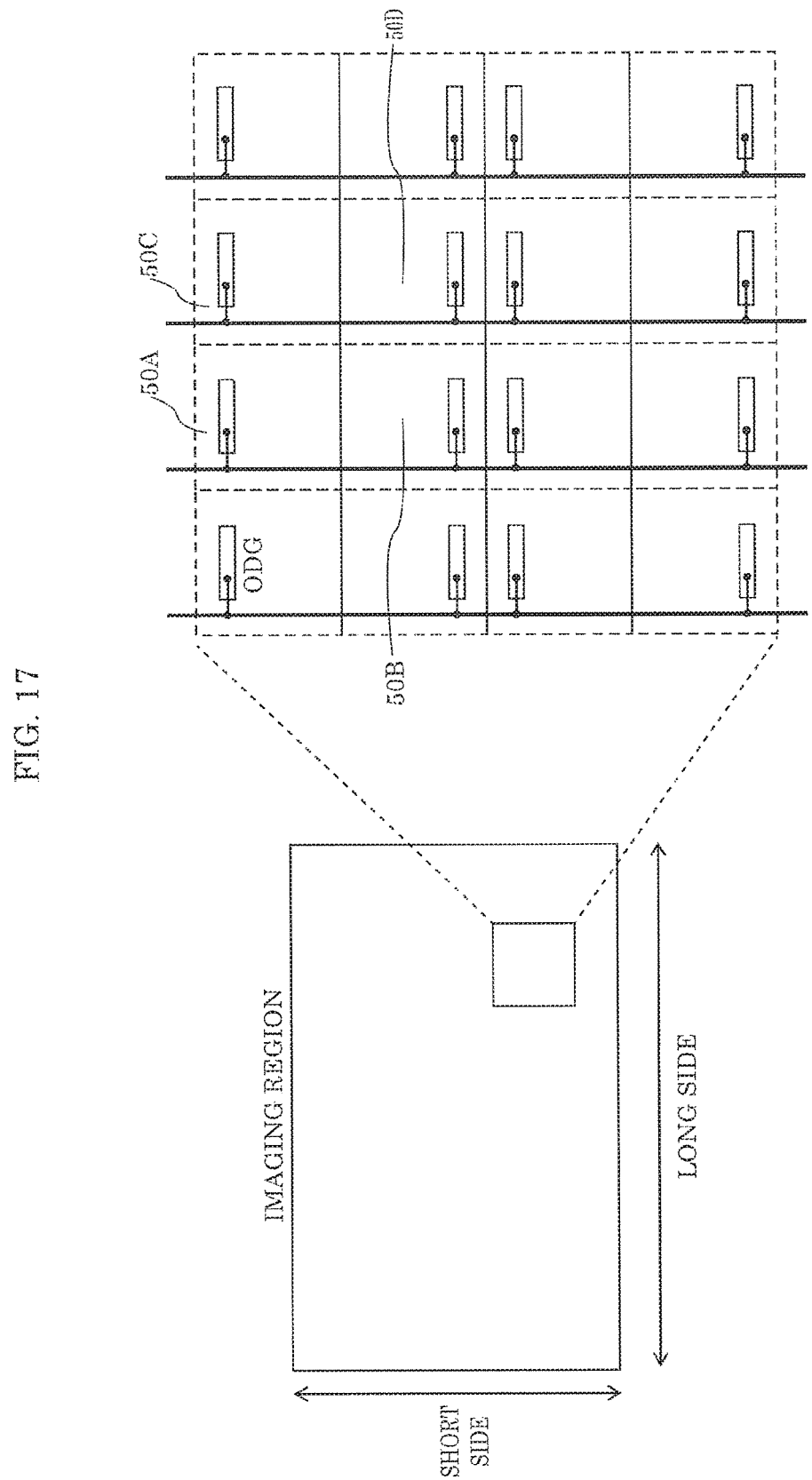

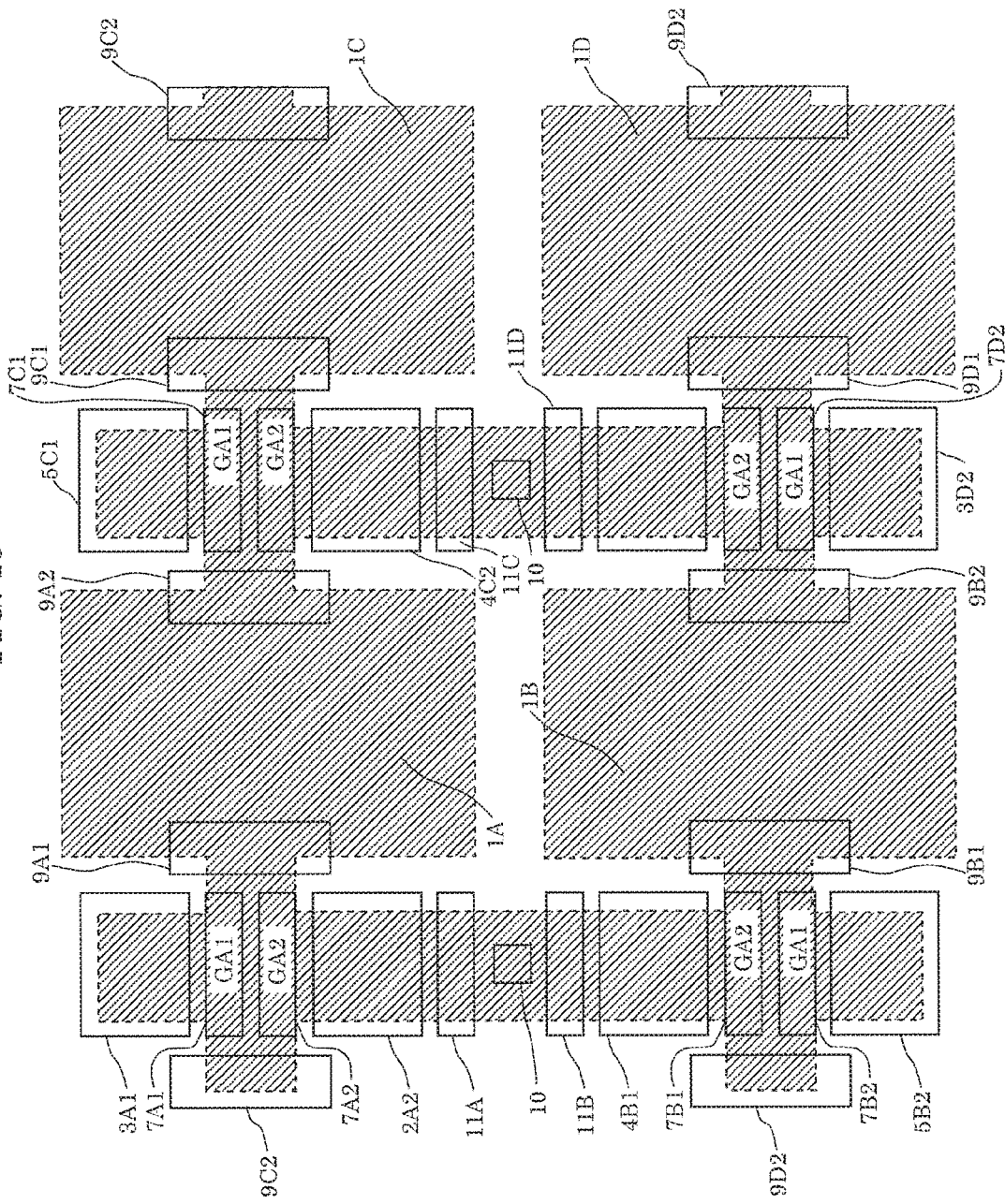

FIG. 25

| IR | G  | IR | G  |
|----|----|----|----|
| R  | IR | B  | IR |
| IR | G  | IR | G  |
| B  | IR | R  | IR |

SOLID-STATE IMAGING DEVICE HAVING INCREASED DISTANCE MEASUREMENT ACCURACY AND INCREASED DISTANCE MEASUREMENT RANGE

CROSS REFERENCE TO RELATED APPLICATIONS

This application is a U.S. continuation application of PCT International Patent Application Number PCT/JP2016/003495 filed on Jul. 28, 2016, claiming the benefit of priority of Japanese Patent Application Number 2015-154591 filed on Aug. 4, 2015, the entire contents of which are hereby incorporated by reference.

BACKGROUND

1. Technical Field

The present disclosure relates to solid-state imaging devices to be used in imaging for distance measurement.

2. Description of the Related Art

Among methods for sensing an object, the time of flight (TOF) method is known in which a distance is measured using flight time that light takes to travel to and return from a measurement object.

Japanese Unexamined Patent Application Publication No. 2004-294420 (Patent Literature 1) discloses the related art in which two different signal storage units store signals obtained by transfer of charge with different phases in synchronization with intermittent behavior of light from a light source, the distance to an object is determined using the distribution ratio of the stored signals, and furthermore, a third signal storage unit stores signals of background light only, and thus background light removal is performed to eliminate the impact of the background light.

SUMMARY

In a general pulse TOF method, exposure periods T1 to T3 are set to have the same length as pulse width Tp where T1 is a first exposure period starting from time of a rising edge of irradiating light having pulse width Tp, T2 is a second exposure period starting from time of a falling edge of the irradiating light, and T3 is a third exposure period in which exposure is performed in a state where the irradiating light is OFF. Suppose that the amount of signals obtained by an imager during first exposure period T1 is denoted as A0, the amount of signals obtained by the imager during second exposure period T2 is denoted as A1, the amount of signals obtained by the imager during third exposure period T3 is denoted as A2, and the speed of light (299,792,458 m/s) is denoted as c, distance L is given by the following equation.

$$L = c \times Tp/2 \times \{(A1-A2)/(A0-A2+A1-A2)\}$$

Here, A2 represents a signal that reflects background light obtained in the state where the irradiating light is OFF, and will be hereinafter referred to as BG.

The solid-state imaging device used in the distance measurement imaging device using this TOF method repeats, more than one time, sampling that is performed for one period of the irradiating light. In the abovementioned TOF method, distance measurement range D is represented as follows.

$$D = c \times Tp/2$$

Meanwhile, PTL 1 discloses broadly classified three methods in each of which an increase in the pulse width (Tp) of the light source leads to an increase in distance measurement range D, but causes a decrease in distance resolution. In other words, the distance measurement accuracy is inversely proportional to the pulse width (Tp) of the light source; there is the problem that when the pulse width of the light source is increased in order to widen the distance measurement range (limit) D, conversely, the distance measurement accuracy is decreased. Disclosed examples of a method for removing the background light include method (a) in which three charge accumulation nodes are used, method (b) in which two charge accumulation nodes are used so that two images, i.e., an image obtained when the irradiating light is ON and an image obtained when the irradiating light is OFF, are read and a difference therebetween is calculated, and method (c) in which an integrator and a voltage control pulse delay circuit are used. In (a), three charge accumulation nodes are necessary, and taking dark current into consideration, a charge-coupled device (CCD) memory is desired; in this case, the aperture ratio drops significantly. Furthermore, the exposure period is determined according to the TX width, and therefore, in the case where the pulse width of the light source is reduced, the TX width is reduced, and there is a need to increase three TX wiring widths for suppressing a pulse wiring delay; thus, there is the problem that sensitivity is reduced, for example, because mechanical vignetting of incident light due to wiring occurs. In (c), the circuitry is complex, and it is not possible to obtain a sufficient aperture ratio in this case either. Thus, there is the problem that miniaturization of pixels, that is, if the number of pixels is the same, downsizing, and if the optical size is the same, an increase in resolution, is difficult. Furthermore, in (b), there is the problem that the background light is different between two images, and thus the distance measurement accuracy is decreased.

In view of the abovementioned problems, the present disclosure has an object to provide a solid-state imaging device which is small, has high distance measurement accuracy, and obtains a distance measurement signal that covers a wide distance measurement range, and provide a method for driving the solid-state imaging device.

In order to solve the abovementioned problems, a solid-state imaging device according to an aspect of the present disclosure includes a plurality of pixels arranged in a matrix on a semiconductor substrate, each of the plurality of pixels including: a photoelectric converter which receives light from an object and converts the light into charge; a plurality of readers which read the charge from the photoelectric converter; a plurality of charge accumulators which accumulate the charge of the photoelectric converter; and a transfer controller which performs a transfer control including controlling whether the charge is transferred or blocked from being transferred. The plurality of readers read the charge of the photoelectric converter to the plurality of charge accumulators, the plurality of pixels include at least a first pixel and a second pixel, and the transfer controller performs the transfer control to cause addition of the charge read from each of the first pixel and the second pixel.

According to the present disclosure, a small solid-state imaging device can obtain a distance measurement signal that covers a wide distance measurement range with high distance measurement accuracy.

BRIEF DESCRIPTION OF DRAWINGS

These and other objects, advantages and features of the disclosure will become apparent from the following descrip

FIG. 17 is a configuration diagram of gate wires of an exposure controller according to Embodiment 1;

FIG. 19 is a schematic plan view illustrating a layout configuration of pixels of a solid-state imaging device according to Embodiment 2;

FIG. 25 illustrates a variation of the pixel arrangement of a solid-state imaging device according to Embodiment 5.

DETAILED DESCRIPTION OF THE EMBODIMENTS

Hereinafter, solid-state imaging devices and methods for driving the same according to the embodiments of the present disclosure will be described with reference to the drawings. Note that each of the following embodiments shows one specific example of the present disclosure; the numerical values, shapes, materials, structural elements, the arrangement and connection of the structural elements, etc., shown in the following embodiments are mere examples, and are not intended to limit the present disclosure.

Embodiment 1

[1-1. Configuration of Distance Measurement Imaging Device]

Figure 1:
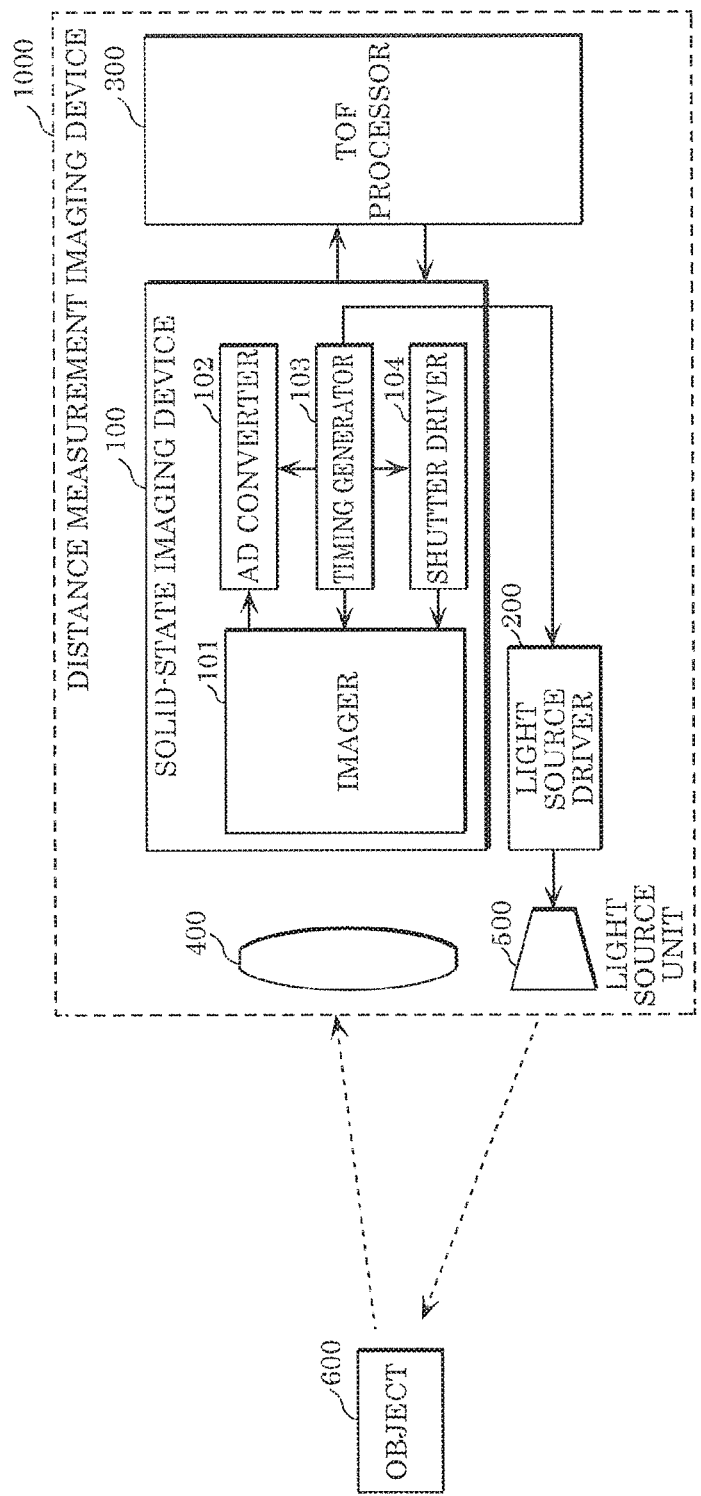
- FIG. 1 is a function block diagram illustrating an example of an outline configuration of a distance measurement imaging device according to Embodiment 1.

FIG. 1 is a function block diagram illustrating an example of an outline configuration of distance measurement imaging device 1000 according to Embodiment 1. As illustrated in this figure, distance measurement imaging device 1000 includes solid-state imaging device 100, light source driver 200, TOF processor 300, optical lens 400, and light source unit 500. Solid-state imaging device 100 includes imager 101, AD converter 102, timing generator 103, and shutter driver 104.

Timing generator 103 is a drive controller which generates a light emission signal instructing light irradiation to object 600 to drive light source unit 500 via light source driver 200, and generates an exposure signal instructing exposure to light reflected from object 600.

Imager 101 performs exposure on a region including object 600 plural times according to timing indicated by the exposure signal generated by timing generator 103, and obtains a signal corresponding to the total amount of the exposure performed plural times.

TOF processor 300 calculates the distance to object 600 on the basis of the signal received from solid-state imaging device 100.

As illustrated in FIG. 1, light source unit 500 emits near infrared light toward object 600 under background light. The light reflected from object 600 enters imager 101 through optical lens 400. The reflected light incident on imager 101 forms an image, and the formed image is converted into an electrical signal. The operations of light source unit 500 and solid-state imaging device 100 are controlled by timing generator 103. The output of solid-state imaging device 100 is converted into a distance image, and also into a visible image depending on the usage, by TOF processor 300. One example of solid-state imaging device 100 is what is called a complementary metal-oxide-semiconductor (CMOS) image sensor.

[1-2. Pixel Circuit Configuration

Figure 2:
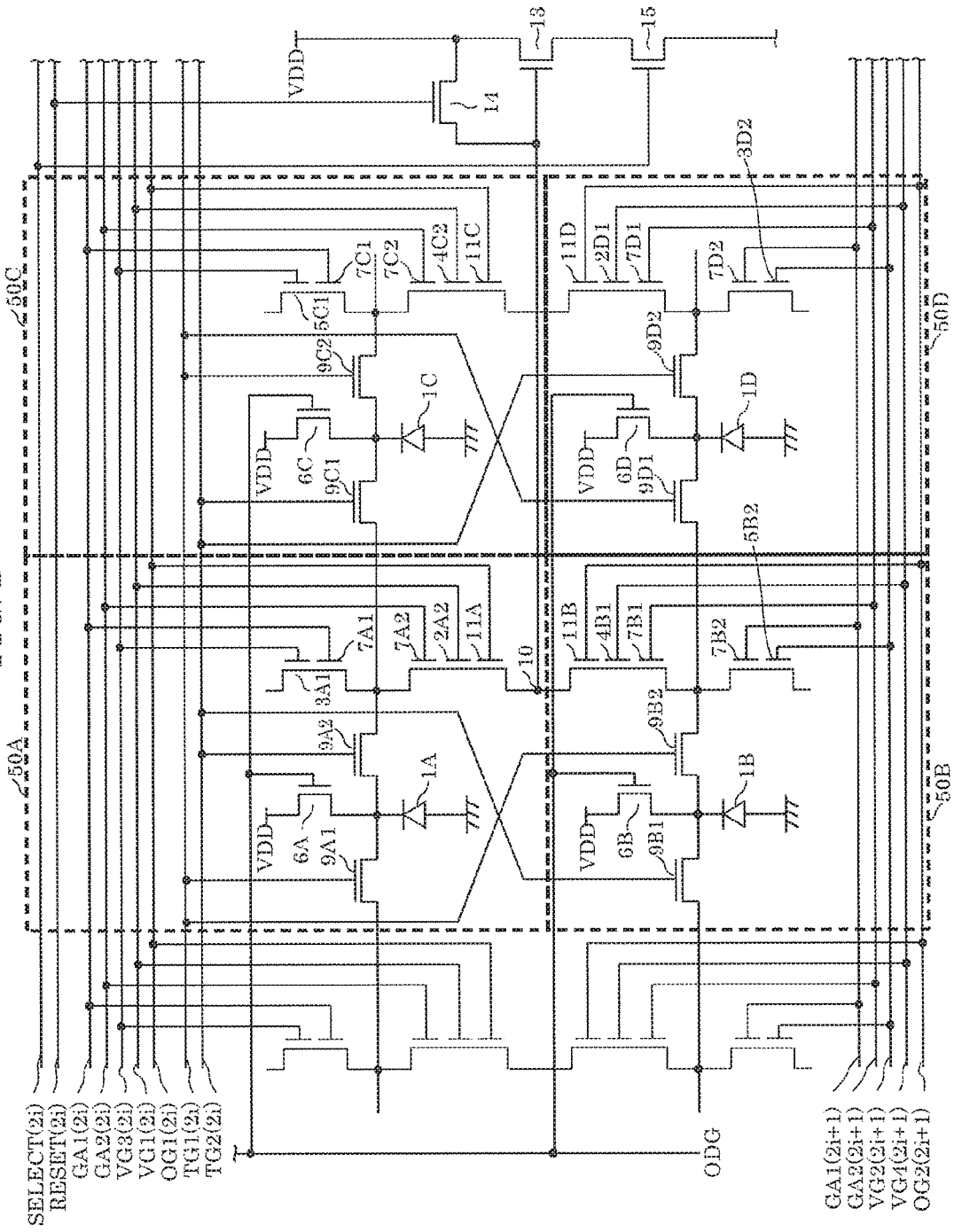
FIG. 2 illustrates a pixel circuit configuration of a solid-state imaging device according to Embodiment 1.

FIG. 2 illustrates a pixel circuit configuration of solid-state imaging device 100 according to Embodiment 1. In this figure, the circuit configurations of pixels 50A, 50B, 50C, and 50D provided in an imaging region of imager 101 are illustrated. In the imaging region of imager 101, a plurality of sets of pixel 50A to pixel 50D are two-dimensionally arranged; among the plurality of pixels 50A to 50D arranged in the imaging region, one set of pixels 50A to 50D is illustrated in in FIG. 2.

Pixel 50A (the first pixel) includes photoelectric converter 1A, readers 9A1 and 9A2, charge accumulators 3A1 and 2A2, distributors 7A1 and 7A2, outputter 11A, and exposure controller 6A.

Pixel 50B (the second pixel) includes photoelectric converter 1B, readers 9B1 and 9B2, charge accumulators 4B1 and 5B2, distributors 7B1 and 7B2, outputter 11B, and exposure controller 6B.

Furthermore, floating diffusion (FD) 10 is disposed in common to pixels 50A and 50B.

Pixel 50C (the third pixel) includes photoelectric converter 1C, readers 9C1 and 9C2, charge accumulators 5C1 and 4C2, distributors 7C1 and 7C2, outputter 11C, and exposure controller 6C.

Pixel 50D (the fourth pixel) includes photoelectric converter 1D, readers 9D1 and 9D2, charge accumulators 2D1 and 3D2, distributors 7D1 and 7D2, outputter 11D, and exposure controller 6D.

Furthermore, amplification transistor 13, reset transistor 14, and selection transistor 15 are disposed in common to pixels 50A to 50D.

Note that a drive pulse is applied to each of two readers provided on one pixel with a different timing, and the pixels are classified by a difference in the arrangement of the readers to which the same drive pulse is applied. Specifically, pixel 50A and pixel 50D are classified as the first unit pixel, and pixel 50B and pixel 50C are classified as the second unit pixel.

[1-3. Driving Method]

Hereinafter, operations of distance measurement imaging device 1000 according to the present embodiment during exposure will be described with reference to FIG. 2 and FIG. 3.

Figure 3:
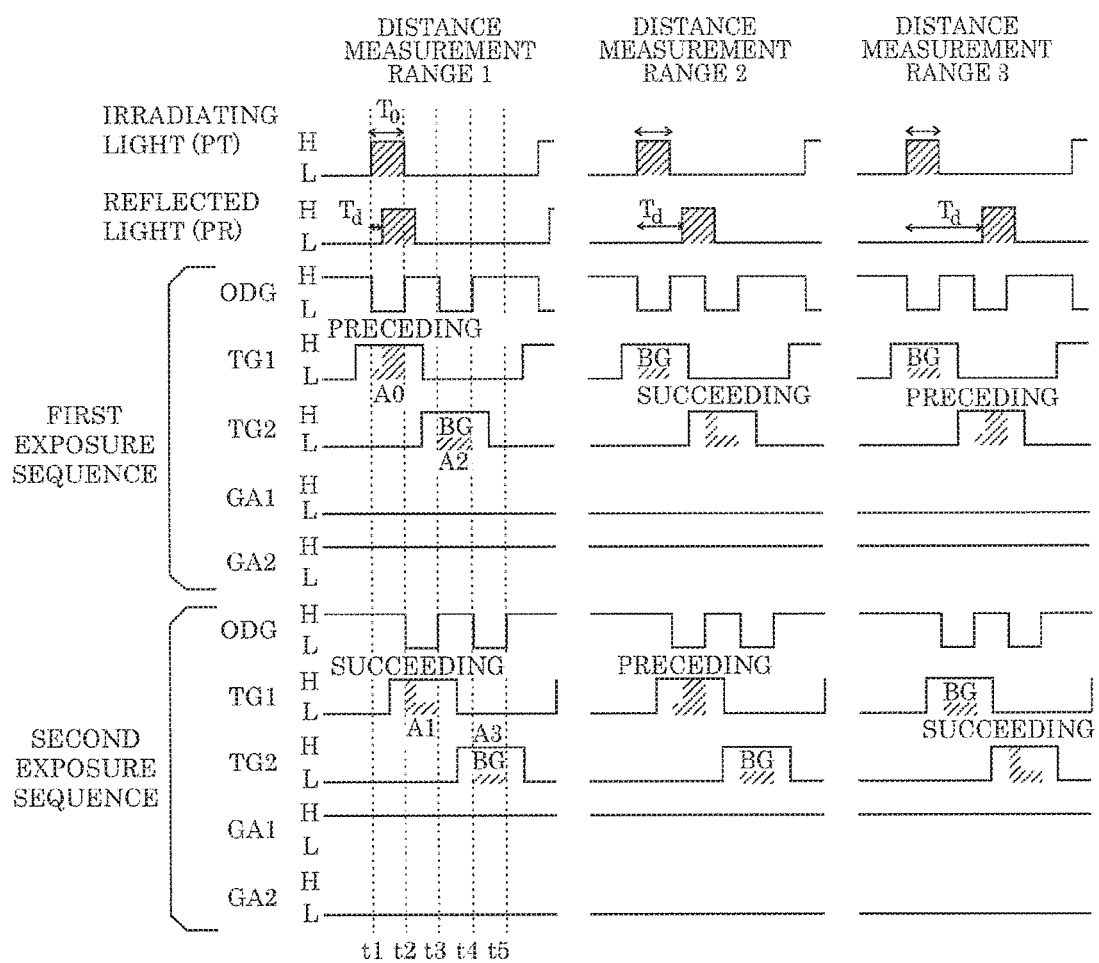
FIG. 3 is a drive timing chart illustrating operations of a solid-state imaging device according to Embodiment 1 during exposure.

FIG. 3 is a drive timing chart illustrating operations of solid-state imaging device 100 according to Embodiment 1 during exposure.

An infrared pulsed beam (irradiating light (PT)) that is repeatedly turned ON and OFF at a constant interval is repeatedly emitted from light source unit 500. In FIG. 3, T0 is the pulse width of irradiating light (PT). An infrared pulsed beam reflected from object 600 (reflected light (PR)) reaches solid-state imaging device 100 with a delay time Td according to the distance from a light source and is converted into a signal charge in the photoelectric converter.

In the exposure period, read pulses are applied with the same timing to the gates of the readers (9A2 an 9C1 in FIG. 2, for example) provided on both sides of a charge distributor (7A1 and 7A2 in FIG. 2, for example), and thus the signal charge in the photoelectric converters (1A and 1C in FIG. 2, for example) present on the both sides is added in the charge distributor. A distribution control gate is present above the charge distributor, and distribution of the charge to charge accumulator 2A2 (the first charge accumulator) and charge accumulator 3A1 (the third charge accumulator) is controlled according to control signals GA1 and GA2.

In the present embodiment, as illustrated in FIG. 3, there are two exposure sequences including the first exposure sequence and the second exposure sequence which are different in the timing of drive pulse signal ODG which is applied to the exposure controller. Although details will be described later, in a light emission pulse period, the exposure control timing includes two charge accumulation periods, and timing for the charge accumulation periods causes a delay by the pulse width of light emission in the first exposure sequence and the second exposure sequence, as illustrated in FIG. 3.

As illustrated in FIG. 3, the first exposure sequence is controlled such that control signal GA1 is in the low level, control signal GA2 is in the high level, and the gates of distributors 7A1, 7B2, 7C1, and 7D2 serve as potential barriers, allowing transfer of the charge to charge accumulators 2A2, 2D1, 4B1, and 4C2 only. Pulses applied to the exposure controller create a state in which the charge is accumulated in the photoelectric converter twice (drive pulse signal ODG switches to the low level twice) in one light emission period. More specifically, in the first charge accumulation state (in the period in which first drive pulse signal ODG is in the low level for the first time), TG1 is ON (in the high level), and the added signals of two pixels are transferred to charge accumulators 4B1 and 4C2. Furthermore, in the second charge accumulation state (in the period in which drive pulse signal ODG is in the low level for the second time), TG2 is ON (in the high level), and the added signals of two pixels are transferred to charge accumulators 2A2 and 2D1.

Next, the second exposure sequence is controlled such that control signal GA1 is in the high level, control signal GA2 is in the low level, and the gates of distributors 7A2, 7B1, 7C2, and 7D1 serve as potential barriers, allowing transfer of the charge to charge accumulators 3A1, 3D2, 5B2, and 5C1 only. As in the first exposure sequence, pulses applied to the exposure controller create a state in which the charge is accumulated in the photoelectric converter twice (drive pulse signal ODG switches to the low level twice) in one light emission period. More specifically, in the first charge accumulation state (in the period in which drive pulse signal ODG is in the low level for the first time), TG1 is ON (in the high level), and the added signals of two pixels are transferred to charge accumulators 5B2 and 5C1. Furthermore, in the second charge accumulation state (in the period in which drive pulse signal ODG is in the low level for the second time), TG2 is ON (in the high level), and the added signals of two pixels are transferred to charge accumulators 3A1 and 3D2.

By the above two exposure sequences, four added distance signals of two pixels are held in four charge accumulators present in the first and second unit pixels in two light emission pulse periods.

Next, the relationship between the measured distance and the signal read and accumulated in each charge accumulator during exposure will be described in detail with reference to FIG. 3. Note that the figure indicates distance measurement range 1, distance measurement range 2, and distance measurement range 3 which are classified by delay time Td of the reflected light (PR); distance measurement with Td having 0 to T0 is classified as distance measurement range 1, distance measurement with Td having T0 to 2T0 is classified as distance measurement range 2, and distance measurement with Td having 2T0 to 3T0 is classified as distance measurement range 3. All of time t1 to time t5 are arranged at the same time interval which is equal to irradiation pulse width T0.

First, distance measurement included in distance measurement range 1 will be described. Hereinbelow, description is given in order from the first exposure sequence to the second exposure sequence, and note that the same symbols t1 to t5 are used as time indication in the description, as illustrated in the figure. After the first exposure sequence is performed, the second exposure sequence is performed. The gate potential of the charge accumulator, which is not illustrated in the drawings, is in the high state during an exposure period.

The first exposure sequence will be described.

As an initial state, drive pulse signal ODG (exposure control pulse signal) is in the high state, and the signal charge in photoelectric converters 1A to 1D of pixels 50A to 50D is discharged to an overflow drain (VDD). Drive pulse signals TG1 and TG2 which are applied to the gates of readers 9A1, 9A2, 9B1, 9B2, 9C1, 9C2, 9D1, and 9D2 are in the low state, and charge accumulators 2A2, 2D1, 4B1, 4C2, 3A1, 3D2, 5B2, and 5C1 which are maintained in the high state are electrically cut off from photoelectric converters 1A to 1D. In this state, signal charge generated in photoelectric converters 1A to 1D is discharged to the overflow drain (VDD) via exposure controllers 6A to 6D, respectively, and is not accumulated in photoelectric converters 1A to 1D.

Next, in synchronization with time t1 at which the irradiating light (PT) is turned ON, drive pulse signal ODG switches to the low state, and the discharge of the charge from photoelectric converters 1A to 1D to the overflow drain (VDD) is stopped. At this time, drive pulse signal TG1 (the first read pulse signal) transitions from the low state to the high state earlier than drive pulse signal ODG by T0/2, and transfer of signal charge generated by entry of the reflected light (PR) containing the background light, to charge accumulator 2A2 and 2D1 via readers 9A1, 9B2, 9C2, and 9D1, and distributors 7A2 and 7D1, is started.

Next, at time t2, drive pulse signal ODG switches to the high state, and the signal charge generated in photoelectric converters 1A to 1D is discharged to the overflow drain (VDD). With this operation, a preceding component (A0) of a reflected pulsed beam containing the background light generated in two photoelectric converters 1A and 1C adjacent via readers 9A1 and 9C2 and two photoelectric converters 1B and 1D adjacent via readers 9B2 and 9D1 is mixed and stored in charge accumulators 2A2 and 2D1.

Next, in synchronization with time t3 at which drive pulse signal ODG switches to the low state, and the discharge of the charge from photoelectric converters 1A to 1D to the overflow drain (VDD) is stopped. At this time, drive pulse signal TG2 (the third read pulse signal) transitions from the low state to the high state earlier than drive pulse signal ODG by T0/2, and transfer of signal charge generated by entry of the background light, to charge accumulators 4B1 and 2C2 via readers 9A2, 9B1, 9C1, and 9D2 and distributors 7B1 and 7C2, is started.

Next, at time t4, drive pulse signal ODG switches to the high state, and the signal charge generated in photoelectric converters 1A to 1D is discharged to the overflow drain (VDD). With this operation, only a background light component (A2=BG) generated in two photoelectric converters 1A and 1C adjacent via readers 9A1 and 9C2 and two photoelectric converters 1B and 1D adjacent via readers 9B2 and 9D1 is mixed and stored in charge accumulators 4B1 and 4C2.

The above-described operations from times t1 to t4 are performed once or repeated more than once before transition to the second exposure sequence.

The second exposure sequence will be described.

As an initial state, drive pulse signal ODG is in the high state, and the signal charge in photoelectric converters 1A to 1D of pixels 50A to 50D is discharged to an overflow drain (VDD). Drive pulse signals TG1 and TG2 which are applied to the gates of readers 9A1, 9A2, 9B1, 9B2, 9C1, 9C2, 9D1, and 9D2 are in the low state, and charge accumulators 2A2, 2D1, 4B1, 4C2, 3A1, 3D2, 5B2, and 5C1 which are maintained in the high state are electrically cut off from photoelectric converters 1A to 1D. In this state, signal charge generated in photoelectric converters 1A to 1D is discharged to the overflow drain (VDD) via exposure controllers 6A to 6D, respectively, and is not accumulated in photoelectric converters 1A to 1D.

Next, in synchronization with time t2 at which the irradiating light (PT) changes from ON to OFF, drive pulse signal ODG switches to the low state, and the discharge of the charge from photoelectric converter 1A to 1D to the overflow drain (VDD) is stopped. At this time, drive pulse signal TG1 (the third read pulse signal) transitions from the low state to the high state earlier than drive pulse signal ODG by T0/2, and transfer of signal charge generated by entry of the reflected light (PR) containing the background light, to charge accumulator 3A1 and 3D2 via readers 9A1, 9B2, 9C2, and 9D1, and distributors 7A1 and 7D2, is started.

Next, at time t3, drive pulse signal ODG switches to the high state, and the signal charge generated in photoelectric converters 1A to 1D is discharged to the overflow drain (VDD). With this operation, a succeeding component (A1) of the reflected pulsed beam containing the background light generated in two photoelectric converters 1A and 1C adjacent via readers 9A1 and 9C2 and two photoelectric converters 1B and 1D adjacent via readers 9B2 and 9D1 is mixed and stored in charge accumulators 3A1 and 3D2.

Next, in synchronization with time t4 at which drive pulse signal ODG switches to the low state, and the discharge of the charge from photoelectric converters 1A to 1D to the overflow drain (VDD) is stopped. At this time, drive pulse signal TG2 (the fourth read pulse signal) transitions from the low state to the high state earlier than drive pulse signal ODG by T0/2, and transfer of signal charge generated by entry of the background light, to charge accumulators 5C1 and 5B2 via readers 9A2, 9B1, 9C1, and 9D2 and distributors 9C1 and 7B2, is started.

Next, at time t5, drive pulse signal ODG switches to the high state, and the signal charge generated in photoelectric converters 1A to 1D is discharged to the overflow drain (VDD). With this operation, only a background light component (A3=BG) generated in two photoelectric converters 1A and 1C adjacent via readers 9A1 and 9C2 and two photoelectric converters 1B and 1D adjacent via readers 9B2 and 9D1 is mixed and stored in charge accumulators 5C1 and 5B2.

With the above-described operations, preceding component A0 of the reflected pulsed beam containing the background light is accumulated in charge accumulators 2A2 and 2D1, background light component BG=A2 is accumulated in charge accumulators 4C2 and 4B1, succeeding component A1 of the reflected pulsed beam containing the background light is accumulated in charge accumulators 3A1 and 3D2, and background light component BG=A3 is accumulated in charge accumulators 5B2 and 5C1.

Using these signals, delay amount Td $(=T0\times((A0-BG)/(A0+A1-2\times BG)))$ of the reflected pulsed beam is determined. In distance measurement range 1, A0>A2 and A1>A3, and distance L to object 600 is calculated according to Equation 1 shown below. Note that in this case, BG which is an exposure amount of the background light may be any of A2, A3, and (A2+A3)/2.

[Math. 1]

$$L = \frac{c \cdot T_0}{2} \times \left( \frac{A1 - BG}{A0 - BG + A1 - BG} \right) \quad \text{(Equation 1)}$$

As described above, the start and the end of signal charge accumulation are determined only by drive pulse signal ODG1.

Note that in a general solid-state imaging device using the TOF principle, the timing of transition of drive pulse X for reading charge from the low level to the high level and the drive timing of transition of gate drive pulse Y at the overflow drain from the high level to the low level are the same. However, for example, even when the difference in delay between those is small at an end of the imaging region, there are cases where the starting position is determined by gate drive pulse Y and the ending position is determined by drive pulse X in the center portion of the imaging region; thus, in addition to the timing adjustment, a designed configuration for delay matching is needed.

In this regard, in distance measurement imaging device 1000 according to the present embodiment, the start and the end of signal charge accumulation are determined only by drive pulse signals ODG, and therefore the delay time can be accurately adjusted.

Drive timing that is the same as or similar to that used for distance measurement range 1 is used for distance measurement range 2 and distance measurement range 3. Note that since the delay amount of the reflected light (PR) is different, a signal component held in each of the charge accumulators is different, which is specifically shown in the table in FIG. 3. In all the cases, it is possible to calculate the distance to object 600 by selecting an appropriate signal, and the distance measurement range, which is $c \times T_0/2$ in a conventional distance measurement imaging device, can be expanded to $3c \times T_0/2$ without reducing the distance measurement accuracy. Moreover, the number of pixels required for obtaining four signals necessary for distance measurement can be reduced to two, and thus the possibility of downsizing is higher than in a conventional case.

In distance measurement range 2, A2>A0 and A1>A3, and distance L is calculated according to Equation 2 shown below. Note that in this case, BG which is an exposure amount of the background light may be any of A0, A3, and (A0+A3)/2.

[Math. 2]

$$L = \frac{c \cdot T_0}{2} \times \left( \frac{A2 - BG}{A1 - BG + A2 - BG} \right) + \frac{c \cdot T_0}{2} \quad \text{(Equation 2)}$$

In distance measurement range 3, A2>A0 and A3>A1, and distance L is calculated according to Equation 3 shown below. Note that in this case, BG which is an exposure amount of the background light may be any of A0, A1, and (A0+A1)/2.

[Math. 3]

$$L = \frac{c \cdot T_0}{2} \times \left( \frac{A3 - BG}{A2 - BG + A3 - BG} \right) + 2 \times \frac{c \cdot T_0}{2} \quad \text{(Equation 3)}$$

Note that the first exposure sequence and the second exposure sequence do not need to be switched for each light emission pulse.

Figure 4:
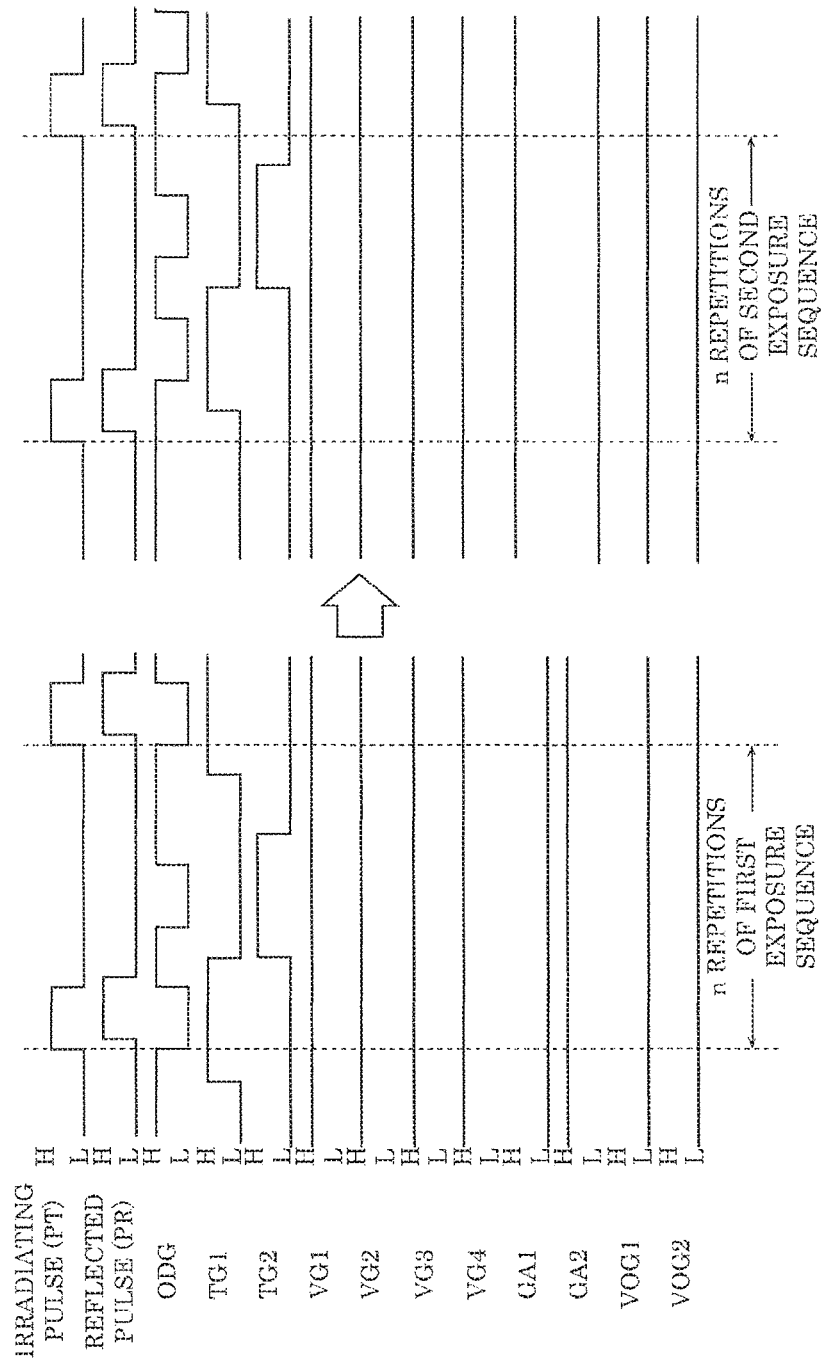
FIG. 4 is a timing chart illustrating an example of a configuration of exposure sequences in a method for driving a solid-state imaging device according to Embodiment 1.

FIG. 4 is a timing chart illustrating an example of a configuration of exposure sequences in a method for driving solid-state imaging device 100 according to Embodiment 1. As illustrated in FIG. 4, unless object 600 moves at very high speed, it is usually sufficient to repeat more than one time the operation of performing the second exposure sequence n times after performing the first exposure sequence n times where n≥1. Furthermore, in the case where subject blur (motion blur) of object 600 in motion occurs because the number of switching between the exposure sequences is insufficient, n may be reduced in accordance with the operating speed of object 600, and the number of repetitions may be increased instead; thus, an adjustment may be made according to object 600.

Furthermore, unlike the present embodiment, in the case of a structure which includes two readers, two charge accumulators, and an exposure controller in each of two unit pixels and in which exposure control pulses different in timing can be applied to the exposure controller in each of the unit pixels, four distance signals can be held in four charge accumulators present in the first and second pixels in one light emission pulse period. Specifically, in this structure, drive pulses of ODG, TG1, and TG2 in the first exposure sequence in FIG. 4 are applied to the gate of one of the unit pixels, and drive pulses of ODG, TG1, and TG2 in the second exposure sequence in FIG. 4 are applied to the gate of the other of the unit pixels. However, in this case, there is a need for two drive pulse signals ODG that are applied to the gate of the exposure controllers at high speed (in at least a few dozen ns periods), and there is also a need for four drive pulses TG that are applied to the gate of the readers, which also requires high-speed driving second to ODG, meaning that the wiring width cannot be reduced. Therefore, an increase in wiring thickness, introduction of a micro wiring process, or the like is needed to ensure a sufficient aperture ratio.

In contrast, distance measurement imaging device 1000 according to the present embodiment has the advantage of being able to increase the aperture ratio because of the structure having a small number of wires due to a small number of pulses that are only one ODG and two TGs, i.e., TG1 and TG2, per two pixels requiring high-speed driving.

Figure 5:
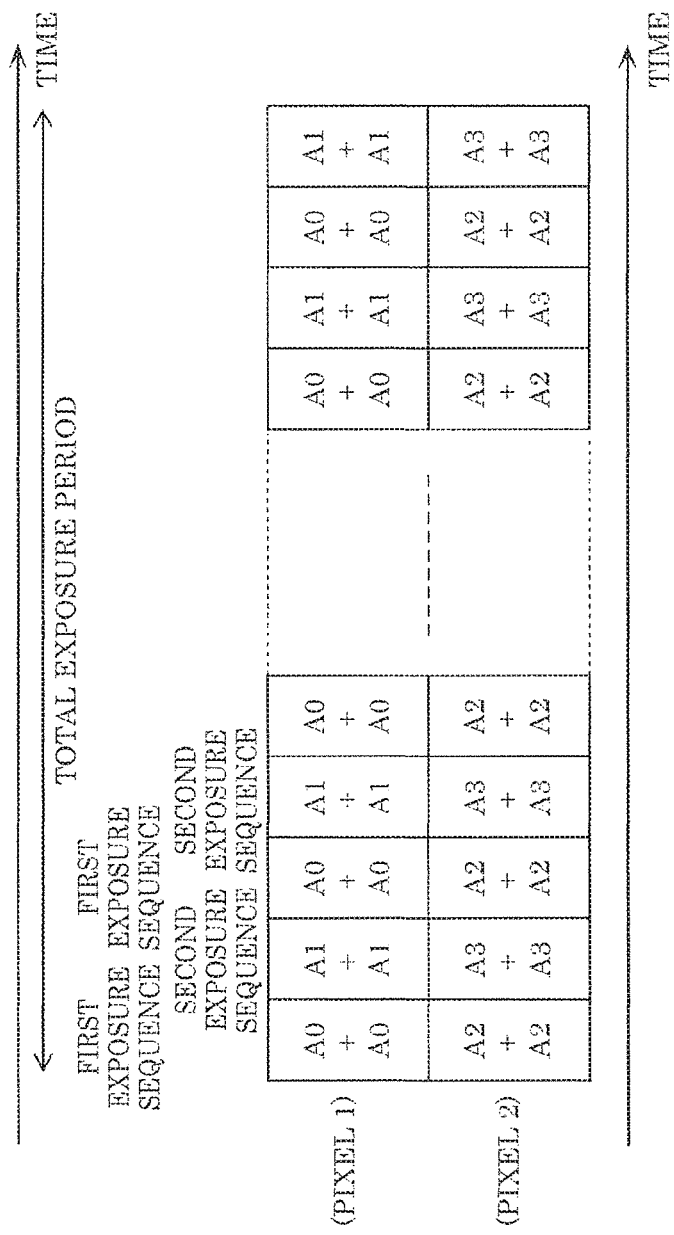
FIG. 5 illustrates comparison between an exposure sequence according to Embodiment 1 and an exposure sequence according to a comparative example.

FIG. 5 illustrates comparison between an exposure sequence according to Embodiment 1 and an exposure sequence according to a comparative example. As illustrated in FIG. 5, in the present embodiment, the exposure sequence is divided into two, and only two distance signals can be obtained in one light emission pulse period. However, since each of the two distance signals results from addition of signals from two pixels, the required number of times of light emission pulses to obtain the same sensitivity is not different from that in the comparative example in which four signals are obtained in one light emission.

Next, the procedure for outputting a distance measurement signal accumulated in the charge accumulator will be described with reference to FIG. 6 and FIG. 7.

Figure 6:
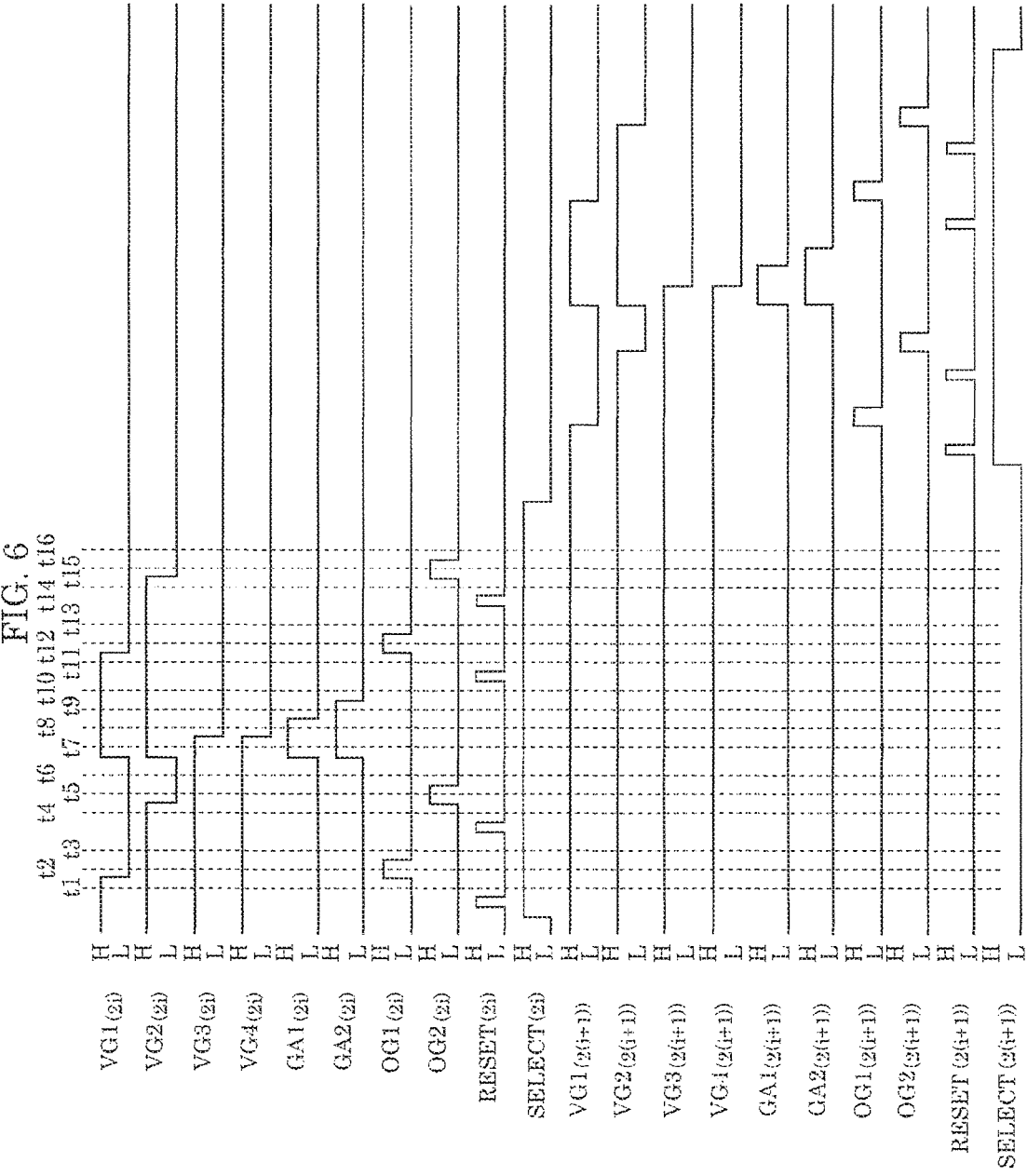
FIG. 6 is a timing chart illustrating distance measurement signal output timing of a solid-state imaging device according to Embodiment 1.

FIG. 6 is a timing chart illustrating distance measurement signal output timing of solid-state imaging device 100 according to Embodiment 1. In FIG. 6, with a configuration in which two pixels 50A and 50B adjacent in the vertical direction share FD 10, two rows including pixels 50A and 50B are denoted by suffix 2i, and two rows located immediately below said two rows are denoted by suffix 2(i+1). Here, i is a natural number. Specifically, the pixels denoted by suffix 2i represent two vertically adjacent pixels in the 2i-th an (2i+1)-th rows, and the pixels denoted by suffix 2(i+1) represent two vertically adjacent pixels in the (2i+

2)-th and (2i+3)-th rows. Furthermore, in FIG. 6, RS represents a drive pulse signal that is applied to the gate of reset transistor 14, and SEL represents a drive pulse signal that is applied to the gate of selection transistor 15.

Figure 7:
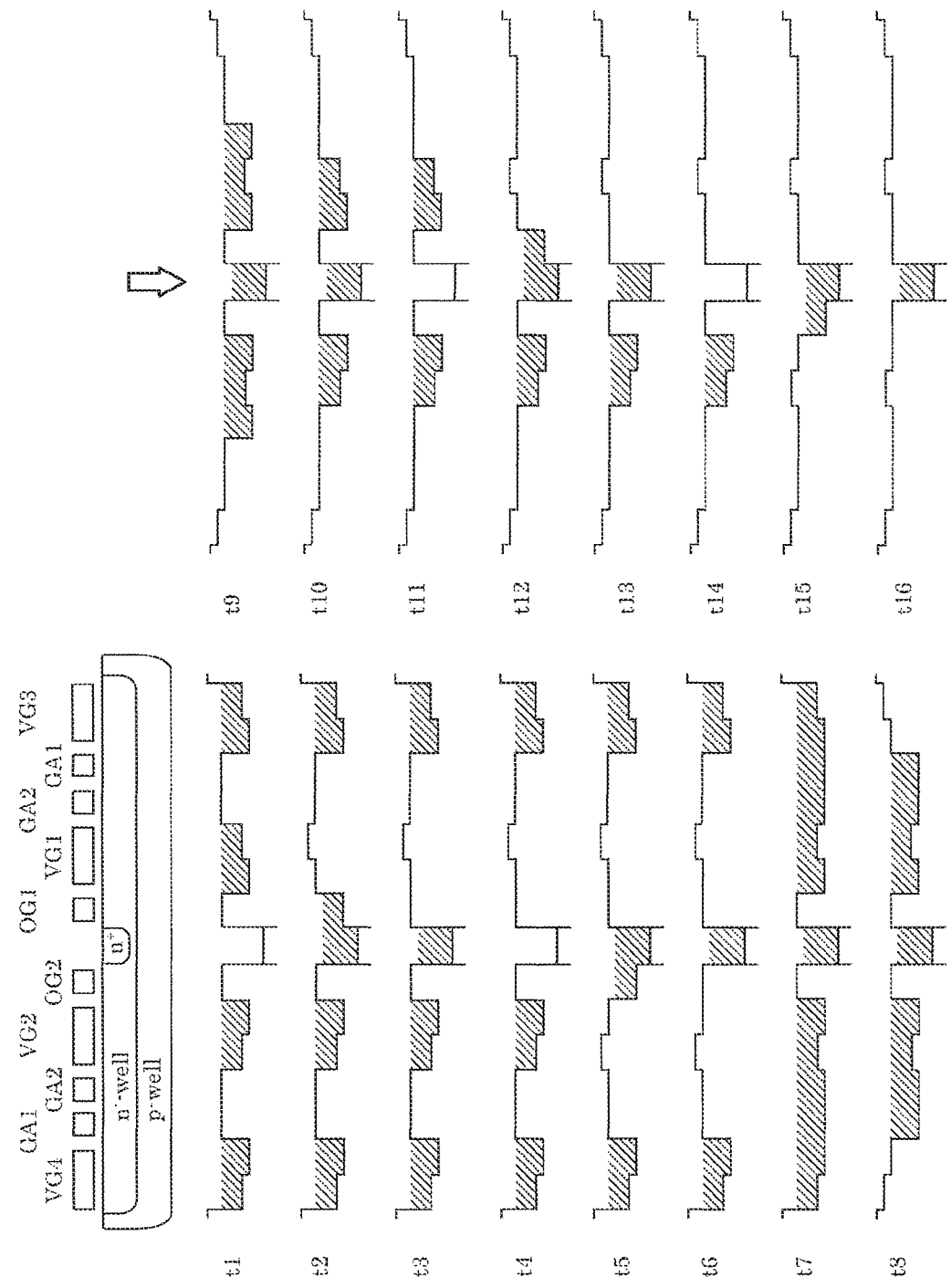
FIG. 7 is a potential diagram for a charge accumulator, a barrier, an outputter, and an FD in the 2i-th and (2i+1)-th rows.

FIG. 7 is a potential diagram for a charge accumulator, a distributor, an outputter, and an FD in the 2i-th and (2i+1)-th rows. Furthermore, the charge accumulator includes a potential step for the purpose of facilitating charge transfer. This potential step can be formed by changing part of the impurity concentration of the charge accumulator.

First, in the state at time t1 which is the initial state, each of charge accumulators 2A2, 4B1, 3A1, and 5B2 has a signal charge accumulated therein after an end of exposure operation. The description below assumes that in association with distance measurement range 1, the initial state is a state in which signal A0 is accumulated in charge accumulator 2A2, signal A1 is accumulated in charge accumulator 3A1, signal A2 (=BG) is accumulated in charge accumulator 4B1, and signal A3 (=BG) is accumulated in charge accumulator 5B2.

Next, time t2, gate voltage VG1 of charge accumulator 2A2 changes to the low state. Accordingly, signal charge A0 held in charge accumulator 2A2 is transferred to FD 10 via outputter 11A. In FD 10, the signal charge is converted into a voltage.

Next, time t3, after gate voltage VOG 1 of outputter 11A changes to the low state, the signal voltage corresponding to signal charge A0 is read to the outside by a source follower circuit including amplification transistor 13 and selection transistor 15.

Next, time t4, drive pulse signal RS is input to reset transistor 14, and FD 10 is reset to a power supply potential.

Next, time t5, gate voltage VG2 of charge accumulator 4B1 changes to the low state. Accordingly, signal charge A2 held in charge accumulator 4B1 is transferred to FD 10 via outputter 11B.

The output of the signal voltage corresponding to signal charge A2 at time t6 is the same as that described above.

Next, time t7, gate voltage VG1 of charge accumulator 2A2, gate voltage VG2 of charge accumulator 4B1, gate voltage GA1 of distributors 7A1 and 7B2, and gate voltage GA2 of distributors 7A2 and 7B1 change to the high state.

Subsequently, time t8 to time t10, gate voltage VG3 of charge accumulator 3A1, gate voltage VG4 of charge accumulator 5B2, gate voltage GA1 of distributors 7A1 and 7B2, and gate voltage GA2 of distributors 7A2 and 7B1 sequentially change to the low state. Accordingly, signal charge A3 and A2 held in charge accumulator 5B2 and 3A1 is transferred to charge accumulator 4B1 and 2A2.

Furthermore, at time t11, FD 10 is reset, and then at time t12, gate voltage VG1 of charge accumulator 2A2 changes to the low state, and thus signal charge A1 is transferred to FD 10 and output as described earlier (time t13).

Next, time t14, FD 10 is reset, and subsequently at time t15, gate voltage VG2 of charge accumulator 4B1 changes to the low state, and signal charge A3 is output (time t16).

With the above operations at time t1 to time t16, the output of the signal charge in the 2i-th row and the (2i+1)-th row is ended; subsequently, the abovementioned operations are sequentially performed on a 2-row basis so that the output of a frame is completed.

Note that the gate of the outputter is pulse-driven by VOG1 and VOG2 in the above description, but can be connected to, for example, the GND. In this case, the potential under the gate of the outputter needs to be low so that the transfer is possible even when VG1 and VG2 are at the low level; thus, although the number of electrons that can be held in the charge accumulators becomes smaller than that in the above-described driving method, a booster circuit provided in the solid-state imaging device can be used to increase the high level for the charge accumulators so that the reduction in the number of electrons is suppressed. With this, it is possible to reduce the number of wires in the pixels, and thus the sensitivity can be enhanced along with an increase in the aperture area to improve the distance measurement accuracy.

[1-4. Layout Configuration of Pixels]

Figure 8:
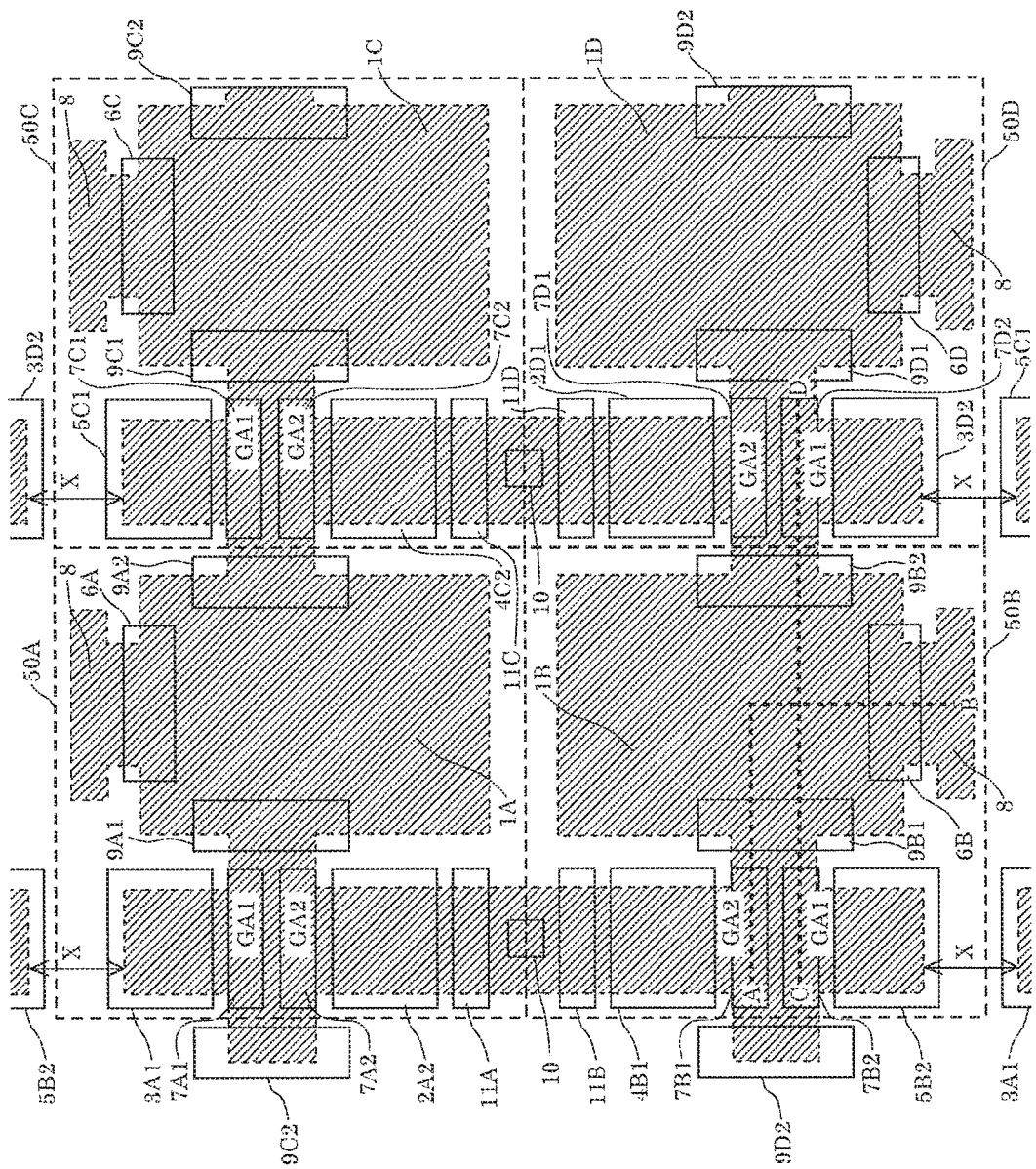
FIG. 8 is a schematic plan view illustrating a layout configuration of pixels of a solid-state imaging device according to Embodiment 1.

FIG. 8 is a schematic plan view illustrating a layout configuration of pixels of solid-state imaging device 100 according to Embodiment 1. The plurality of pixels of imager 101 are two-dimensionally arranged in the imaging region on a semiconductor substrate, and pixels 50A and 50D, which are the two first unit pixels, and pixels 50B and 50C, which are the two second unit pixels, are arranged in a checkered pattern to form a single pixel unit. FIG. 8 illustrates the layout configuration of a single pixel unit including pixels 50A to 50D having the circuit configuration illustrated in FIG. 2.

As illustrated in FIG. 8, pixel 50A includes photoelectric converter 1A, charge accumulators 2A2 and 3A1, exposure controller 6A, distributors 7A1 and 7A2, overflow drain 8, readers 9A1 and 9A2, and outputter 11A. Pixel 50B includes photoelectric converter 1B, charge accumulators 4B1 and 5B2, exposure controllers 6B, distributors 7B1 and 7B2, overflow drain 8, readers 9B1 and 9B2, and outputter 11B. Pixels 50A and 50B share FD 10. Pixel 50C includes photoelectric converter 1C, charge accumulators 4C2 and 5C1, exposure controllers 6C, distributors 7C1 and 7C2, overflow drain 8, readers 9C1 and 9C2, and outputter 11C. Pixel 50D includes photoelectric converter 1D, charge accumulators 2D1 and 3D2, exposure controllers 6D, distributors 7D1 and 7D2, overflow drain 8, readers 9D1 and 9D2, and outputter 11D. Pixels 50C and 50D share FD 10.

Photoelectric converters 1A to 1D receive light reflected from object 600 and accumulate signal charge generated by photoelectric conversion.

Charge accumulators 2A2 and 3A1 are the first charge accumulator and the third charge accumulator, respectively, which mix and hold the signal charge accumulated in photoelectric converter 1A and photoelectric converter 1C of pixel 50C (not illustrated in the drawings) adjacent to the left of pixel 50A. Charge accumulators 4B1 and 5B2 are the second charge accumulator and the fourth charge accumulator, respectively, which mix and hold the signal charge accumulated in photoelectric converter 1B and photoelectric converter 1D of pixel 50D (not illustrated in the drawings) adjacent to the left of pixel 50B. Charge accumulators 4C2 and 5C1 are the second charge accumulator and the fourth charge accumulator, respectively, which mix and hold the signal charge accumulated in photoelectric converter 1C and photoelectric converter 1A of pixel 50A adjacent to the left of pixel 50C. Charge accumulators 2D1 and 3D2 are the first charge accumulator and the third charge accumulator, respectively, which mix and hold the signal charge accumulated in photoelectric converter 1D and photoelectric converter 1B of pixel 50B adjacent to the left of pixel 50D.

Exposure controllers 6A to 6D control the accumulation of the signal charge in photoelectric converters 1A to 1D at the same time.

Overflow drain 8 is a charge discharger, is provided adjacent to photoelectric converters 1A to 1D across exposure controllers 6A to 6D, and discharges, through exposure controllers 6A to 6D, the signal charge accumulated in photoelectric converters 1A to 1D.

The distributor is provided between the first charge accumulator and the third charge accumulator and is provided between the second charge accumulator and the fourth charge accumulator. More specifically, distributors 7A1 and 7A2 are provided between charge accumulators 2A2 and 3A1. Distributors 7B1 and 7B2 are provided between charge accumulators 4B1 and 5B2. Distributors 7C1 and 7C2 are provided between charge accumulators 4C2 an 5C1. Distributors 7D1 and 7D2 are provided between charge accumulators 2D1 and 3D2.

Each of outputters 11A to 11D is provided adjacent to one of two charge accumulators disposed in a pixel. More specifically, outputter 11A is provided adjacent to charge accumulator 2A2 which is one of the two charge accumulators. Outputter 11B is provided adjacent to charge accumulator 4B1 which is one of the two charge accumulators. Outputter 11C is provided adjacent to charge accumulator 4C2 which is one of the two charge accumulators. Outputter 11D is provided adjacent to charge accumulator 2D1 which is one of the two charge accumulators.

The reader can read the signal charge from the photoelectric converter and accumulate the signal charge in the first charge accumulator, the third charge accumulator, the second charge accumulator, and the fourth charge accumulator via the distributor. More specifically, the signal charge read from reader 9A1 is accumulated in charge accumulator 3A1 via distributor 7A1 and accumulated in charge accumulator 2A2 via distributor 7A2.

The signal charge read from reader 9A2 is accumulated in charge accumulator 5C1 via distributor 7C1 and accumulated in charge accumulator 4C2 via distributor 7C2. Readers 9B1, 9B2, 9C2, 9D1, and 9D2 are configured in a similar manner, and thus description thereof will be omitted.

FD 10 is disposed adjacent to one of the two charge accumulators in a pixel across the outputter, and converts the signal charge into a voltage.

Each of the charge accumulator, the reader, the distributor, the outputter, and the exposure controller is formed by stacking a gate insulating film and a gate electrode above the semiconductor substrate.

In a pixel unit including four pixels 50A to 50D described above, the charge accumulators are shared by two horizontally adjacent pixels, and moreover the FD is shared by two vertically adjacent pixels. Note that overflow drain 8 is desirably shared by adjacent pixel units that are next to each other in the vertical direction.

Note that FD 10 is connected to the source follower circuit, and amplifies and outputs a signal converted from a charge into a voltage; the configuration thereof is the same as or similar to a normal metal-oxide-semiconductor (MOS) image sensor, and thus description thereof will be omitted here, and the illustrations of amplification transistor 13 and selection transistor 15 in the source follower are omitted in FIG. 8.

The gate electrodes of the two readers of each of pixels 50A to 50D are provided bilaterally symmetrically with respect to the photoelectric converter, and are disposed opposite to each other on two parallel sides of the outer edge of a light-receiving region of the photoelectric converter. The gate of the reader is provided close to the gate of the exposure controller. The exposure controller is disposed on a side of the light-receiving region that is sandwiched between, and is orthogonal to, the abovementioned two parallel sides on which the gate electrodes of the abovementioned two readers are disposed, and is located symmetrically with respect to a center line that passes through the center of the light-receiving region and is parallel to the abovementioned two sides.

To exemplify this on pixel 50A, the gates of readers 9A1 and 9A2 are provided bilaterally symmetrically with respect to photoelectric converter 1A and are provided close to the gate of exposure controller 6A. More specifically, the gates of readers 9A1 and 9A2 are provided on opposite sides of the outer edge of photoelectric converter 1A, and the gate of exposure controller 6A is provided on a side that is orthogonal to said opposite sides and is sandwiched between said opposite sides. The gates of the readers of pixels 50B to 50D are also arranged and configured in the same or similar manner. The reason for this will be described below.

If the gate electrodes of the readers are not provided bilaterally symmetrically, when leakage signals are generated due to background light or the like, the signals are not evenly distributed and are read at different rates. This leads to an error in the value obtained after subtraction of the background light in distance calculation, resulting in a decrease in the distance measurement accuracy. In order to inhibit this phenomenon, the gates of the readers are arranged bilaterally symmetrically so that the amount of leakage signals due to background light or the like is equalized.

Figure 9:
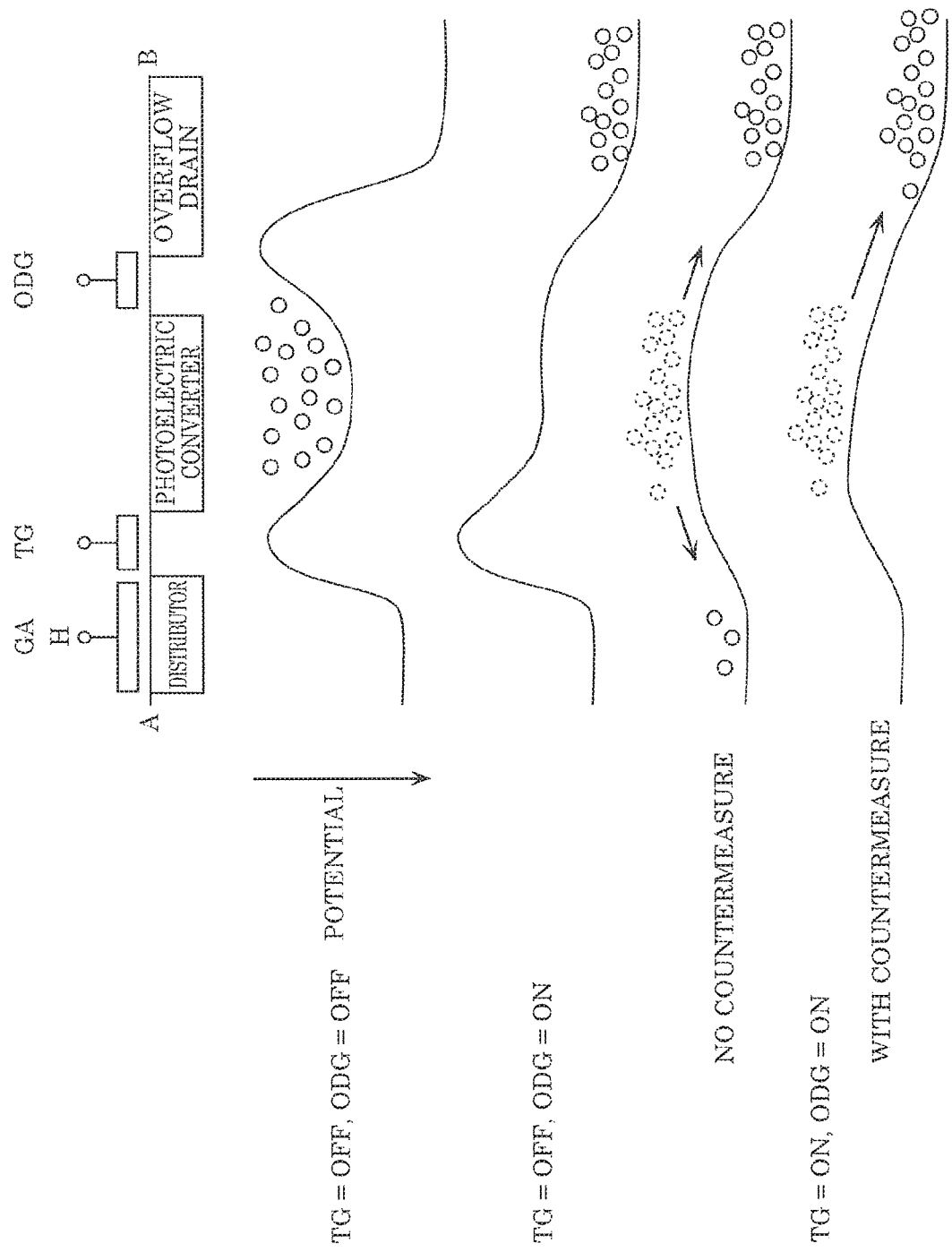
FIG. 9 illustrates a distribution of potentials in a photoelectric converter and surrounding parts thereof according to Embodiment 1.

FIG. 9 illustrates a distribution of potentials in the photoelectric converter and surrounding parts thereof according to Embodiment 1. FIG. 9 illustrates the distribution of potentials in the A-B cross-section in FIG. 8. In the present embodiment, when the gate of the exposure controller is in the high state (in FIG. 9, ODG=ON), the entire signal charge generated by light entry is desirably discharged to overflow drain 8. However, a small portion of the charge moves toward the gate of the reader under the influence of the potential distribution formed in the photoelectric conversion region. At this time, when the gate of the reader is in the high state (in FIG. 9, TG=ON and ODG=ON: no countermeasure), unnecessary charge leaks into the charge accumulator and is superimposed on principal signal charge, reducing the distance measurement accuracy.

Furthermore, when leakage signals are generated due to background light, a leakage component is superimposed on a background light signal, and thus the light resistance is reduced in a circumstance under high luminous background light.

In order to inhibit this phenomenon, the gate of the exposure controller is provided close to the gate of the reader.

With this, as illustrated in FIG. 9, it is possible to position, close to the reader, the vertex of the potential in the photoelectric converter when both the gate of the exposure controller and the gate of the reader are in the high state (in FIG. 9, TG=ON and ODG=ON: with countermeasure). Thus, the occurrence of the leakage components of charge moving toward the readers can be reduced.

Furthermore, in order to obtain the same or similar advantageous effects, the potential under the gate of the exposure controller (drive pulse signal ODG) may be set lower than the potential under the gate of the reader (drive pulse signal TG).

Figure 10:
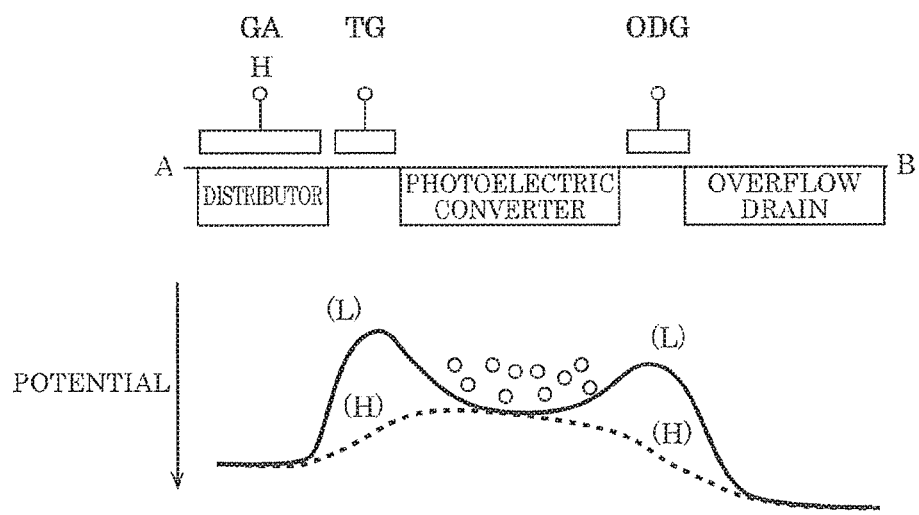
FIG. 10 illustrates a distribution of potentials in a photoelectric converter and surrounding parts thereof according to a variation of Embodiment 1.

FIG. 10 illustrates a distribution of potentials in a photoelectric converter and surrounding parts thereof according to a variation of Embodiment 1. With this, it is possible to position, close to the reader, the vertex of the potential in the photoelectric converter when both drive pulse signals TG and ODG are at the high level, and thus the same or similar advantageous effects can be obtained. Examples of a means for achieving this goal include a method of superimposing DC bias on drive pulse signal ODG, aside from a method of making the impurity concentration of the exposure controller different from the impurity concentration of the reader.

Figure 11:
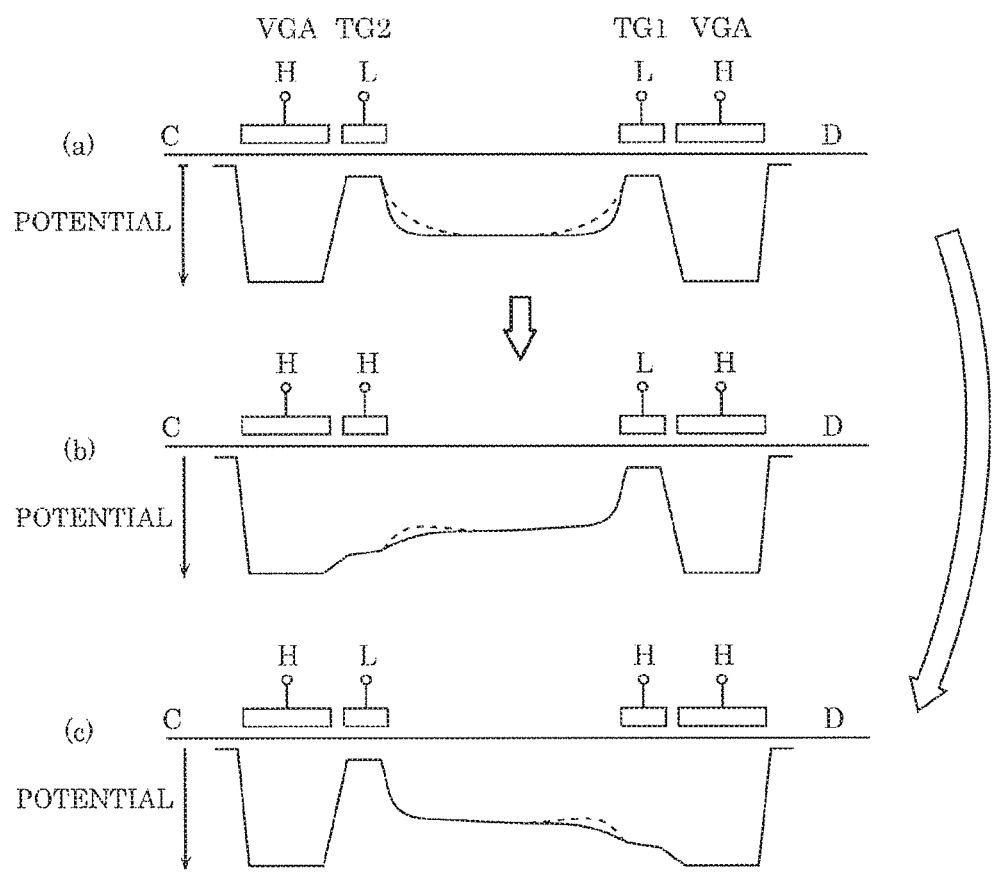
FIG. 11 illustrates a distribution of potentials in the horizontal direction in a photoelectric converter and surrounding parts thereof according to Embodiment 1.

FIG. 11 illustrates a distribution of potentials in the horizontal direction in the photoelectric converter and surrounding parts thereof according to Embodiment 1. FIG. 11 illustrates the distribution of potentials in the C-D cross-section in FIG. 8; the solid line represents the distribution of potentials in the present embodiment, and the dashed line represents the distribution of potentials in a conventional example. Since the gate of the reader is disposed on both sides of the photoelectric converter, the potential near the gate on the both sides is flat so that charge can be transferred in both directions. With this, as illustrated in (b) in FIG. 11, when drive pulse signal TG1 switches to the high level, and as illustrated in (c) in FIG. 11, when drive pulse signal TG2 switches to the high level, a smooth potential slope from the photoelectric converter to the charge accumulator is obtained so that charge in the photoelectric converter can be completely transferred for a short period of time. Thus, it is possible to improve the distance measurement accuracy of a solid-state imaging device for distance measurement that is required to completely transfer charge at high speed.

Note that drive pulse signals in phase are applied to the gate electrodes of charge accumulator 3A1 and 5B2 and charge accumulator 3D2 and 5C1 which are charge accumulators on the far side from the shared FD, and thus there is no need to separate the gates; 3A1 and 5B2 may be the same gate electrodes as 3D1 and 5C1. With this, it is possible to reduce the number of wires in the pixels, and the aperture area can be increased. Separation between the charge accumulators under the shared gate electrode may be achieved by the shallow trench isolation (STI) or may be achieved by implantation. The width of this separation part is 2X, which is twice as large as X in FIG. 8, and the latter can make the separation width smaller; thus, the gate length of the charge accumulator can be increased so that the area of the accumulator can increase, allowing an increase in the amount of accumulated charge.

[1-5. Variation]

Next, a variation of Embodiment 1 according to the present disclosure will be described with reference to the drawings.

Figure 12:
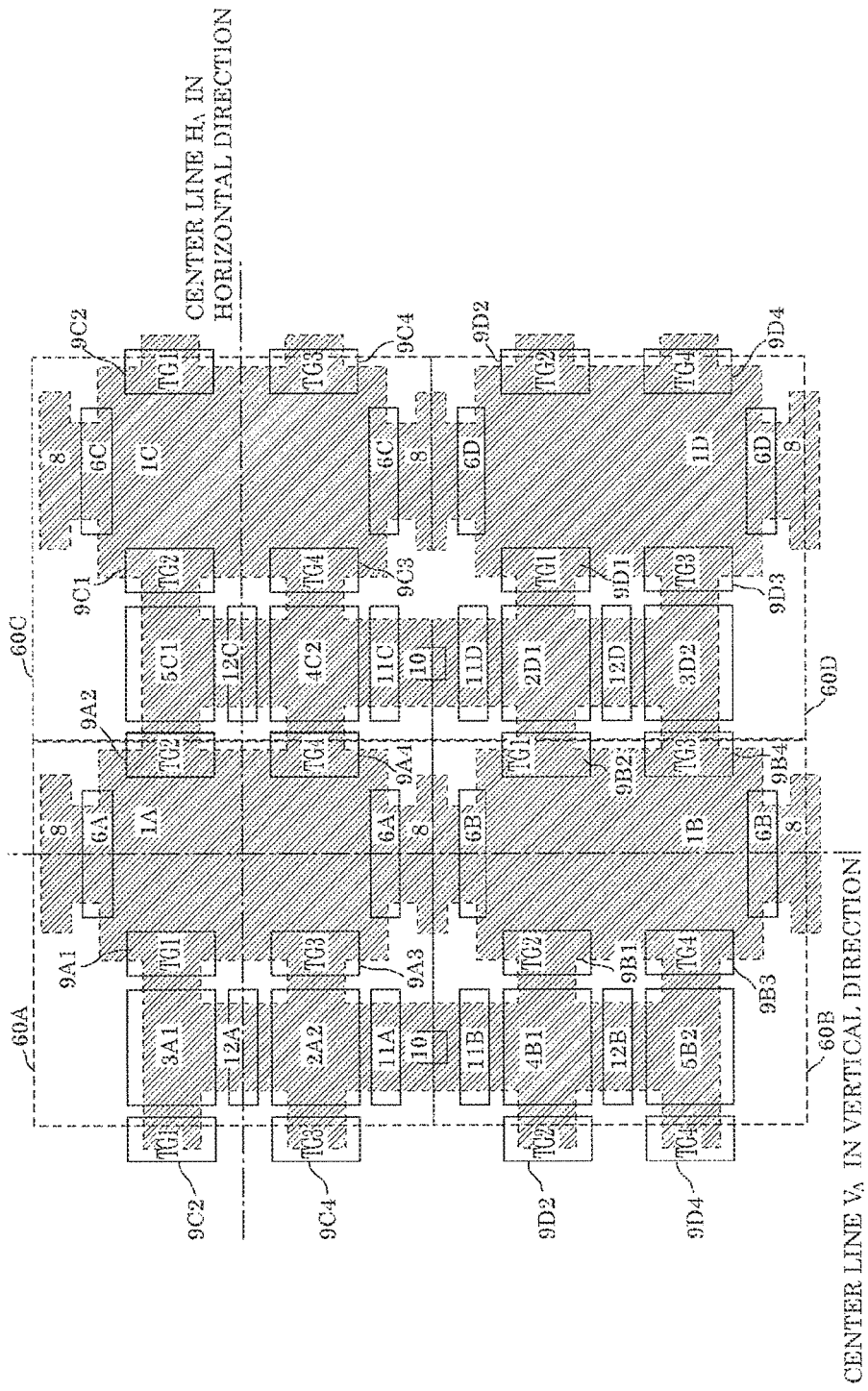
FIG. 12 is a schematic plan view illustrating a layout configuration of pixels according to a variation of Embodiment 1.

FIG. 12 is a schematic plan view illustrating a layout configuration of pixels of solid-state imaging device 100 according to a variation of Embodiment 1. The plurality of pixels of imager 101 are two-dimensionally arranged in the imaging region on the semiconductor substrate, and pixels 60A and 60D, which are the two first unit pixels, and pixels 60B and 60C, which are the two second unit pixels, are arranged in a checkered pattern to form a single pixel unit. The following description will be centered on differences from Embodiment 1.

As illustrated in FIG. 12, in the present variation as well, the photoelectric converter, the charge accumulator, the exposure controller, the overflow drain, the reader, and the outputter are provided, but the distributor illustrated in FIG. 8 is not provided, and transfer controllers 12A, 12B, 12C, and 12D for controlling whether the charge is transferred or blocked from being transferred are provided between two charge accumulators.

The light-receiving region of the photoelectric converter has a rectangular shape in a plan view of the semiconductor substrate. The two gate electrodes of one half of four readers of each unit pixel are axisymmetrically arranged, and the two gate electrodes of the other half of the four readers are axisymmetrically arranged. Furthermore, the two gate electrodes of the abovementioned one half and the two gate electrodes of the abovementioned other half are disposed opposite to each other on two parallel sides of the outer edge of the light-receiving region. In other words, each of the first unit pixel and the second unit pixel includes four readers, and the gate electrodes of the four readers are disposed on two parallel sides of the outer edge of the light-receiving region of the photoelectric converter in such a manner that each side has two gate electrodes and such sets of the two gate electrodes are disposed opposite to each other across the photoelectric converter. Furthermore, in a plan view of the semiconductor substrate, the gate electrodes of the readers are arranged symmetrically with respect to center lines $H_A$ and $V_A$ passing through the center of the light-receiving region of the photoelectric converter. The exposure controllers are disposed on two sides orthogonal to the sides on which the reader gates are disposed in such a manner that each side has one exposure controller, and in a plan view of the semiconductor substrate, the exposure controllers are each provided close to the reader and are arranged symmetrically with respect to center line $H_A$. Operations of this element will be described below.

In Embodiment 1, as illustrated in FIG. 3 and FIG. 4, the high and low levels of control signals GA1 and GA2 which are applied to the distribution control gates of the distributors in the first exposure sequence and the second exposure sequence need to be changed between the exposure sequences. In contrast, in the present variation, as illustrated in FIG. 13, a VC signal which is applied to the transfer controller is at the low level during the exposure period so that the transfer of charges between the charge accumulators is blocked.

Figure 13:
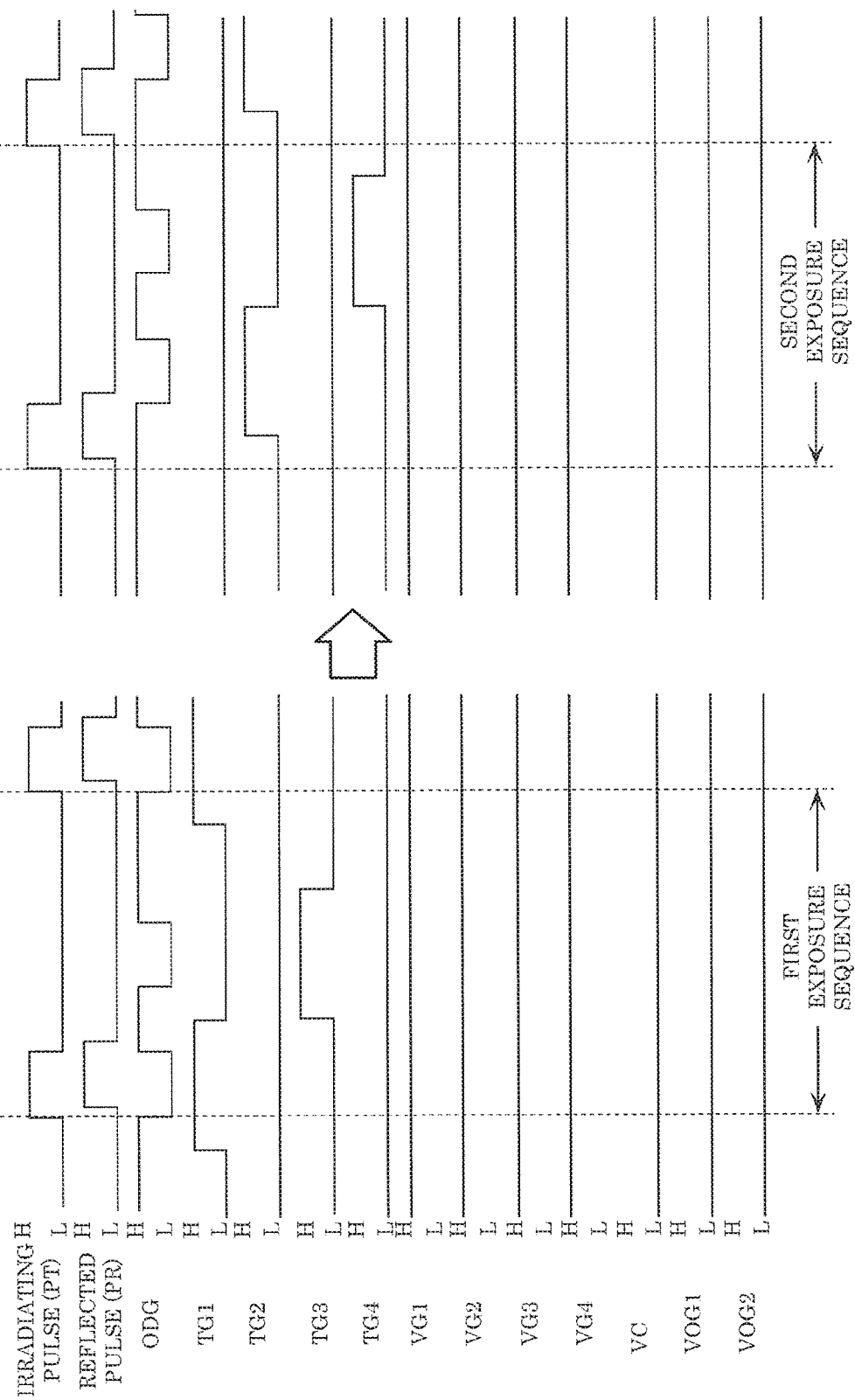
FIG. 13 is a timing chart illustrating an example of a configuration of exposure sequences in a method for driving a solid-state imaging device according to a variation of Embodiment 1.

FIG. 13 is a timing chart illustrating an example of a configuration of the exposure sequences in a method for driving the solid-state imaging device according to the variation of Embodiment 1.

In the present variation, in the first exposure sequence, read pulse signal TG1, which is applied to read gates 9A1, 9B2, 9C2, and 9D1, and read pulse signal TG3, which is applied to read gates 9A3, 9B4, 9C4, and 9D3, switch to the high level so that charges in adjacent photoelectric converters are read and transferred directly to the charge accumulators without passing through the distributors, and then are mixed.

In the second exposure sequence, read pulse signal TG2, which is applied to read gates 9A2, 9B1, 9C1, and 9D2, and read pulse signal TG4, which is applied to read gates 9A4, 9B3, 9C3, and 9D4, switch to the high level so that charges in the photoelectric converters are transferred directly to the charge accumulators and then mixed, as in the first exposure sequence.

In the present variation, there is no distributor controlling the direction in which charge is accumulated into the charge accumulators, and thus it is not necessary to change the control signal that is applied to the distributor upon transition from the first exposure sequence to the second exposure sequence, which saves time for the transition. Furthermore, in Embodiment 1, if the distribution is frequently performed, power consumption by the control signal applied to the distribution control gate becomes high, whereas, in the present example, it is possible to switch between the first exposure sequence and the second exposure sequence by merely switching the drive pulse signal that is applied to the read gate, an thus the power consumption is constant regardless of the number of switches of the sequences and can be less than that in Embodiment 1. Therefore, from the standpoint of reducing motion blur, a desirable drive is a constantly performed drive in which, after the first exposure sequence is performed once, the second exposure sequence is performed once, and the set of this process is repeated.

Furthermore, Embodiment 1 uses two distribution control gates, whereas, the present variation uses a single transfer control gate; thus, the area of the charge accumulator can be increased, enhancing the amount of accumulated charge.

Regarding wiring, four wires are connected to the read gates as TG1 to TG4, which are two more wires than in Embodiment 1, but there are no longer two wires that are connected to the distribution control gates, and one wire increases as a wire to the transfer control gate; thus, there is only one wire added in total.

However, regarding the transfer controller and the outputter, in the case where the potential is set low by implantation so that the transfer can be performed even when the gate of the charge accumulator is at the low level, it is possible to apply a reference potential (for example, GND) to the gate; in this case, there is no increase in the number of wires.

Furthermore, in the present variation, as indicated in the description for (Equation 1), (Equation 2), and (Equation 3), the set of A0 and A2 signals or A1 and A3 signals which are used to determine, according to the magnitude relationship between the signals, whether the current signal is a background light component or a signal including a signal for distance calculation including the background light component can be obtained from the same photoelectric converter. Accordingly, each set has the same background light component, and there is the advantage that even if the photoelectric converter includes dark current output due to defects or the like, such output can be canceled out by the difference. In order to utilize this advantage, (Equation 1) may be replaced by Equation 4 below for distance measurement range 1.

[Math. 4]

$$L = \frac{c \cdot T_0}{2} \times \left( \frac{A1 - A3}{A0 - A2 + A1 - A3} \right) \quad \text{(Equation 4)}$$

For distance measurement range 2, (Equation 2) may be replaced by Equation 5 below.

[Math. 5]

$$L = \frac{c \cdot T_0}{2} \times \left( \frac{A2 - A0}{A1 - A3 + A2 - A0} \right) + \frac{c \cdot T_0}{2} \quad \text{(Equation 5)}$$

For distance measurement range 3, (Equation 3) may be replaced by Equation 6 below.

[Math. 6]

$$L = \frac{c \cdot T_0}{2} \times \left( \frac{A3 - A1}{A2 - A0 + A3 - A1} \right) + 2 \times \frac{c \cdot T_0}{2} \quad \text{(Equation 6)}$$

[1-6. Layout of Pixels]

Next, the layout of a plurality of pixels will be described.

Figure 14A:
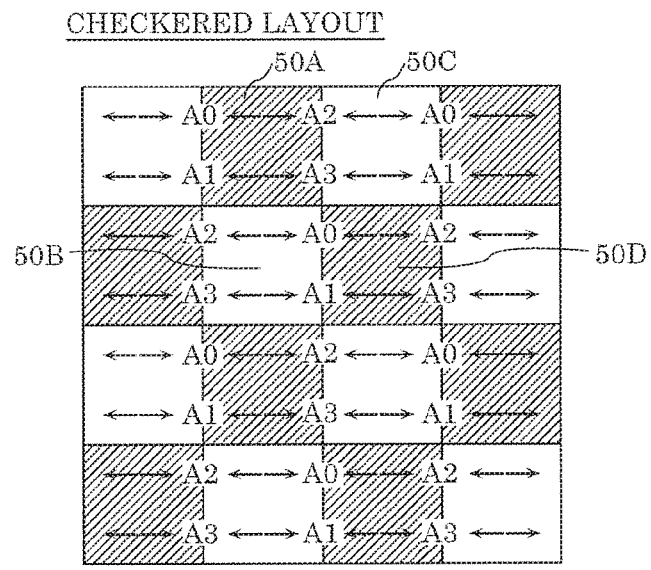
FIG. 14A illustrates the layout of pixels arranged in a checkered pattern.
Figure 14B:
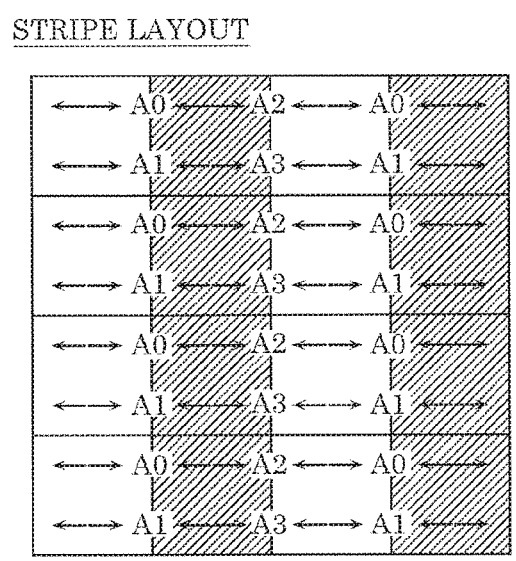
FIG. 14B illustrates the layout of pixels arranged in a stripe pattern.

FIG. 14A illustrates the layout of pixels arranged in a checkered pattern, and FIG. 14B illustrates the layout of pixels arranged in a stripe pattern. The first unit pixels (pixels 50A and 50D) and the second unit pixels (pixels 50B and 50C) illustrated in FIG. 8 may each be arranged in a checkered pattern or in a stripe pattern, as illustrated in FIG. 14A and FIG. 14B.

Figure 15:
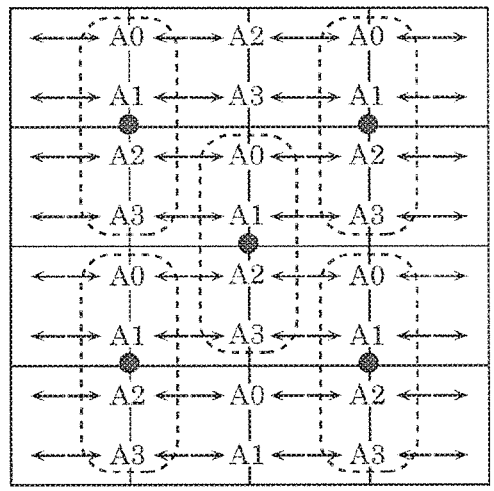
FIG. 15 illustrates the center of gravity of distance data in the layout of pixels arranged in a checkered pattern.

FIG. 15 illustrates the center of gravity of distance data in the layout of pixels arranged in a checkered pattern. In FIG. 15, as an example of calculation of distance data in the imaging region, the dashed line represents a range of calculation for signals for distance calculation that are output from the pixel unit, and the black circle represents the center of gravity of distance data obtained by such calculation.

The stripe layout is useful in an application in which only the horizontal resolution is considered important, whereas the checkered layout illustrated in FIG. 15 is preferred when both the horizontal and vertical resolutions are required. Furthermore, as illustrated in FIG. 15, in the case of the checkered layout, since the centers of gravity of the distance data after the distance calculation are located in a checkered pattern, the vertical and horizontal resolutions aligned in the checkered pattern are substantially equal to the case where distance data is present for each pixel.

Conventionally, four charge accumulators and four readers are needed in each pixel to obtain substantially the same distance range as that in the present embodiment in the case where the distance data is present for each pixel. Furthermore, since it is necessary to drive the four readers at high speed, the wiring width becomes large; thus, if this is implemented with the same pixel size, a decrease in the aperture ratio is a problem, and an increase in the size of the driver circuit is also a problem. Moreover, considering the aspect of a decrease in frame rate with twice as many signals for distance calculation, it can be said that the configuration in the present embodiment in which four signals for distance calculation are obtained by separate first unit pixels and second unit pixels arranged in a checkered pattern is very efficient.

Figure 16:
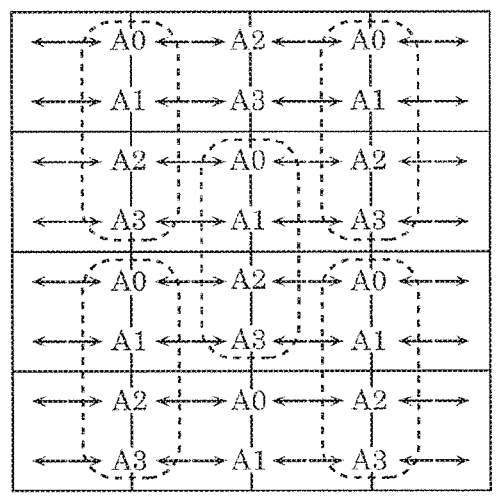
FIG. 16 illustrates an FD shared layout in the layout of pixels arranged in a checkered pattern.

Note that the method of sharing FD 10 in the case of the checkered layout may be based on a sharing layout illustrated in FIG. 16, for example.

FIG. 16 illustrates a FD sharing layout in the layout of the pixels arranged in the checkered pattern. As illustrated in this figure, when the FD sharing layout is matched to the distance calculation range, the signals for distance calculation that are used in the distance data in the checkered pattern are output from the same FD amplifier. Therefore, the calculation can be performed without being affected by variations in sense capacitance between the pixels and variations in gain between amplifiers. Thus, it is possible to obtain high distance accuracy compared to the case where a distance is calculated using signals for distance calculation output from different FD amplifiers.

FIG. 17 is a gate wiring diagram of the exposure controller according to Embodiment 1. Drive pulse signal ODG is applied to the gate wires of the exposure controller (exposure control gate wires), and therefore when there is a delay due to the wiring capacity, gate capacity, and wiring resistance within the imaging region, the distance after calculation changes within an imaging surface, resulting in a decrease in distance measurement accuracy. Furthermore, when the falling edge and the rising edge of drive pulse signal ODG are delayed, it is difficult to read the signal charge. Thus, the gate wires of the exposure controller are desirably arranged parallel to the short side of the imaging region and are further desirably supplied with the drive pulse signal from both ends of the gate wires.

Furthermore, in the present embodiment, DC bias may be superimposed on drive pulse signal ODG that is applied to the gate of the exposure controller which controls exposure time. This advantageous effect will be described below.

Figure 18A:
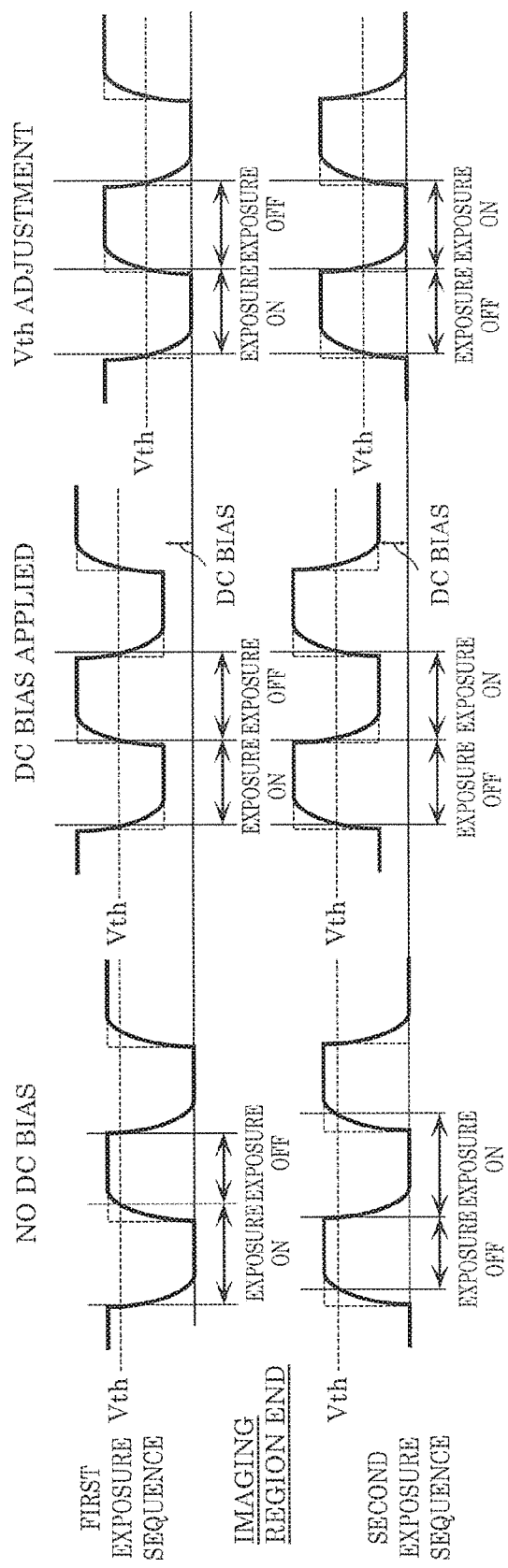
FIG. 18A illustrates a delay of an exposure control pulse at an end of an imaging region according to Embodiment 1.
Figure 18B:
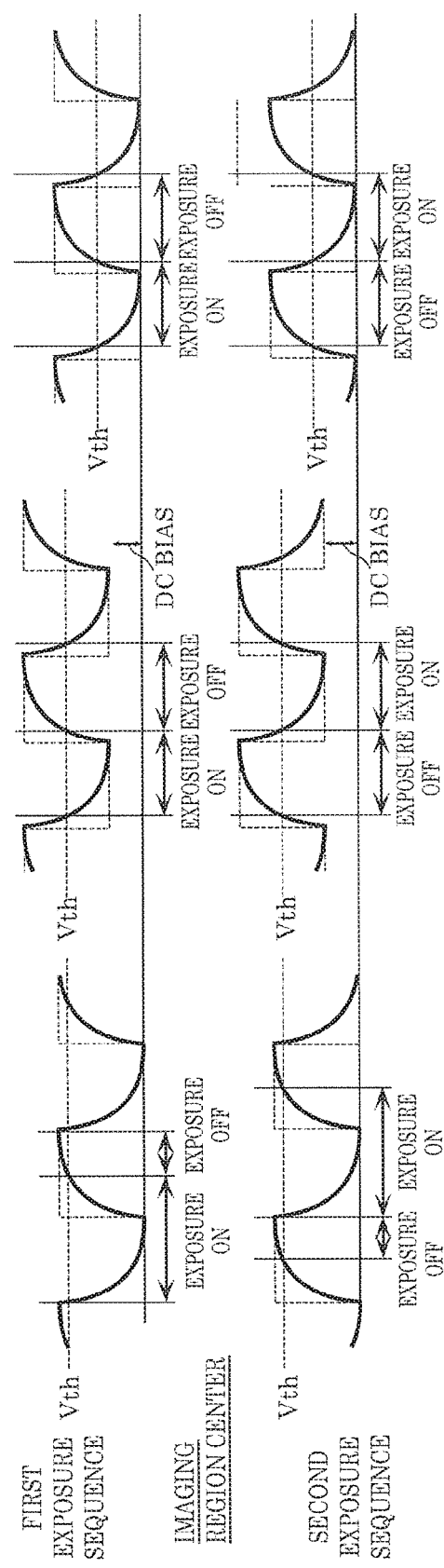
FIG. 18B illustrates a delay of an exposure control pulse at the center of an imaging region according to Embodiment 1.

FIG. 18A illustrates a delay of drive pulse signal ODG at an end of the imaging region according to Embodiment 1, and FIG. 18B illustrates a delay of drive pulse signal ODG at the center of the imaging region according to Embodiment 1.

The reset level of drive pulse signal ODG needs to be low in voltage because a power supply voltage is 2.8 V for mobile use, etc., but sometimes becomes close to the power supply voltage. Assuming that Vth is this reset level, as illustrated on the left side (no DC bias) in FIG. 18A and FIG. 18B, when Vth is high, there is a difference in duty between an exposure ON period and an exposure OFF period, and the roundness of the waveform causes a misalignment in duty between the end and the center of the imaging region. In this state, there is an overlap between two exposure OFF periods, and thus the resultant value after the calculation is different between the center and the end even when the distance to the subject is the same. In order to make corrections, if one of the exposure pulses is delayed to avoid the overlap in the center portion, the exposure ON period is separated at the end, and thus the distance calculation cannot be performed at the end.

In contrast, as illustrated at the center (DC bias applied) in FIG. 18A and FIG. 18B, DC bias is applied to drive pulse signal ODG so that Vth is located at the amplification center of the pulse width. Accordingly, the duty can be 1:1 both at the end and at the center of the imaging region. Furthermore, the high level becomes higher than the level of the read pulses, and thus the occurrence of leakage can be reduced.

Note that as illustrated on the right side (Vth adjustment) in FIG. 18A and FIG. 18B, it is possible to obtain the same advantageous effects as the DC bias by making the impurity concentration of the exposure controller different from the impurity concentration of the reader so that the potential of the exposure controller becomes higher than the potential of the reader. In this case, Vth is desirably 50% of the amplitude of drive pulse signal ODG.

As described in detail above, with the solid-state imaging device and the method for driving the same according to the present embodiment, it is possible to expand the distance measurement range and improve the distance measurement accuracy by using a small solid-state imaging device. Specifically, the occurrence of an in-plane delay of the exposure control pulse is reduced, and the unique exposure sequence and the reduction in the number of wires allow a high aperture ratio to be maintained even with an increased number of charge accumulators. Thus, it is possible to improve the distance range without degrading the distance measurement accuracy.

Embodiment 2

A solid-state imaging device and a method for driving the same according to Embodiment 2 will be described, focusing on differences from Embodiment 1.

FIG. 19 is a schematic plan view illustrating a layout configuration of pixels of the solid-state imaging device according to Embodiment 2. As illustrated in this figure, a distance measurement imaging device according to the present embodiment is different from distance measurement imaging device 1000 according to Embodiment 1 in that the exposure controller and the overflow drain are removed.

As described in Embodiment 1, the use of two exposure sequences allows the exposure controller to be controlled by one kind of drive pulse signals ODG, and thus in addition to the configuration in which control is performed at the overflow drain and the gate of the exposure controller as in Embodiment 1, it is also possible to control the exposure by a substrate shutter using a vertical overflow drain (VOD) structure which is used for a capacitive coupling element.

Thus, when the VOD is used to perform exposure control, since there is no need to provide the overflow drain and the exposure controller, the area of the photoelectric converter can be increased, as illustrated in FIG. 19. Furthermore, since the exposure controller and wires thereof can be removed, it is possible to increase the aperture ratio. Moreover, when the substrate shutter is used, compared to a system in which the control is performed at the gate of the exposure controller with high load capacity by using micro wiring, the load capacity can be small, and it is possible to use a low-resistance substrate and a low-resistance epilayer; thus, improvement can be made to the difference in delay between exposure control pulses within the imaging region. In addition, when a driver circuit that generates a substrate shutter pulse is provided exteriorly, it is also possible to apply the shutter pulse from the back of the substrate; in this case, there is almost no in-plane delay of exposure pulses.

Also in the variation of Embodiment 1, the exposure controller can be controlled by one kind of drive pulse signals, and thus it is possible to control the exposure by the substrate shutter using the VOD structure. Although not illustrated in the drawings, also in this case, there is no need to provide the overflow drain and the exposure controller, and thus the area of the photoelectric converter can be increased, as in FIG. 19.

As described above, with the solid-state imaging device according to the embodiment, it is possible to provide a solid-state imaging device for distance measurement which has a high aperture ratio and good in-plane distance accuracy by the substrate shutter using the vertical overflow drain.

Embodiment 3

A solid-state imaging device and a method for driving the same according to Embodiment 3 will be described, focusing on differences from Embodiment 1.

Figure 20:
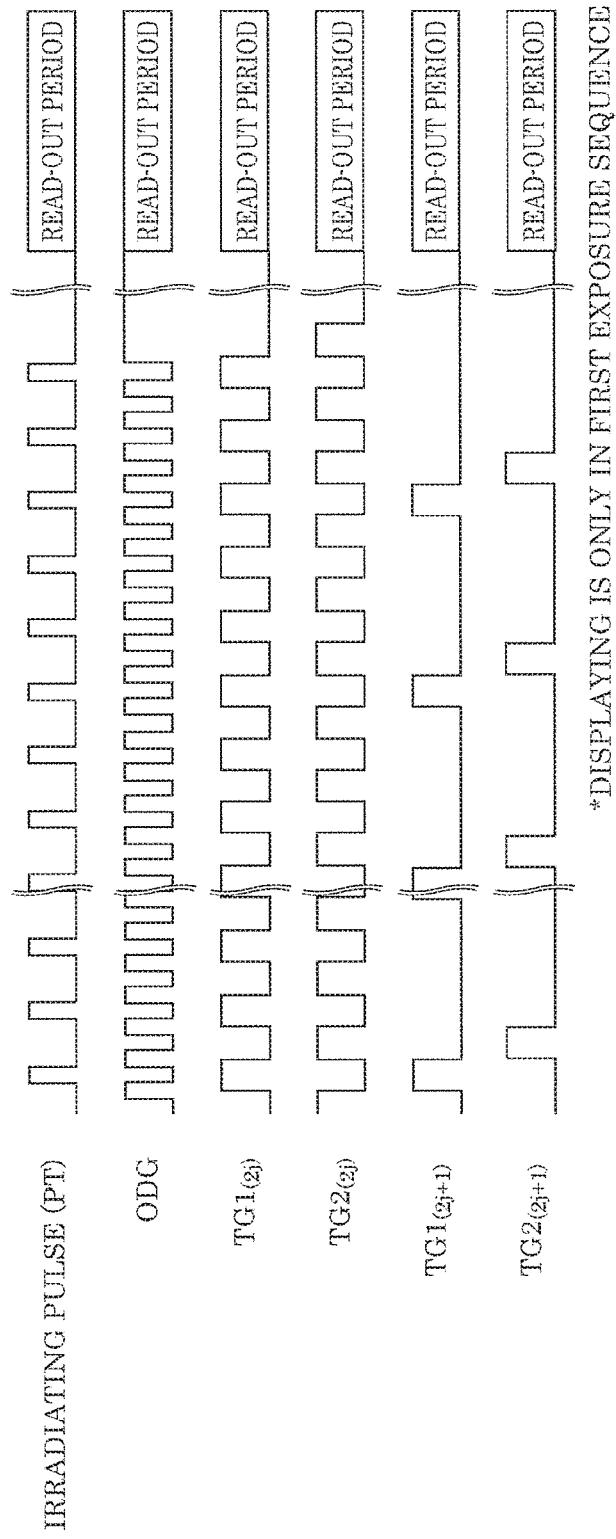
FIG. 20 is a timing chart illustrating a method for driving a solid-state imaging device according to Embodiment 3.
Figure 21:
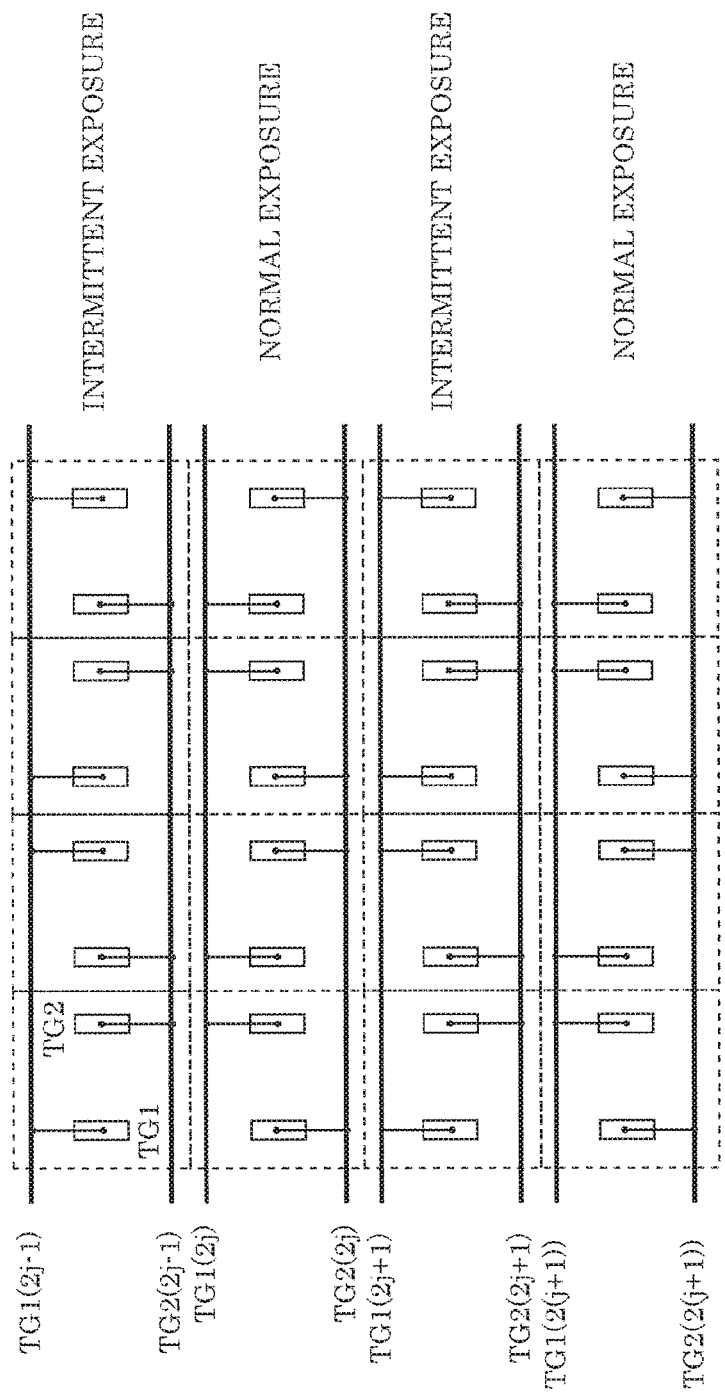
FIG. 21 is a schematic plan view of an imaging region for explaining that a different read control is performed for each pixel row in a solid-state imaging device according to Embodiment 3.

FIG. 20 is a timing chart illustrating a method for driving the solid-state imaging device according to Embodiment 3. FIG. 21 is a schematic plan view of an imaging region for explaining that a different read control is performed for each pixel row in the solid-state imaging device according to Embodiment 3. Note that FIG. 21 illustrates only the operations for four pixels in the vertical direction by four pixels in the horizontal direction in order to simplify the drawings.

In a TOF distance measurement device using near infrared light, the impact of reflectance of object 600 needs to be considered. When object 600 has low reflectance, the reflected light is weak, and therefore it is necessary to increase light source power or increase the length of the exposure period, but in the case where object 600 having high reflectance is also present on the subject, the charge accumulator which accumulates signals from object 600 having high reflectance is saturated, and thus the signals for distance calculation cannot be accurately calculated.

In this regard, in Embodiment 3, in order to cope with a wide range of the reflectance of objects 600, the number of times drive pulse signal TG is applied to the gate of the reader is changed for each row, and thus read control is performed in such a way that the charge accumulator is not saturated even when object 600 having high reflectance is present. Specifically, as illustrated in FIG. 20, the number of times of exposure is different between drive pulse signal TG1 in the 2j-th row and drive pulse signal TG1 in the 2j+1-th row, and the number of times of exposure is different between drive pulse signal TG2 in the 2j-th row and drive pulse signal TG2 in the 2j+1-th row. FIG. 21 illustrates the case where the gate wire of the reader (reader gate wire) is in the lateral direction; it is possible to adjust the amount of signals that are read to the charge accumulator on a per-row basis.

Note that as illustrated in FIG. 20, the reading is skipped desirably at equal intervals, throughout all the exposure periods, in a row in which the number of times of exposure is small, compared to the case where the reading is performed more on the first half of the exposure after the start, for example, because simultaneity can be maintained.

As described above, with the solid-state imaging device according to Embodiment 3, it is possible to accurately obtain a distance image even in a situation where objects 600 having significantly different levels of reflectance are present.

Embodiment 4

A solid-state imaging device and a method for driving the same according to Embodiment 4 will be described, focusing on differences from Embodiment 1.

Figure 22:
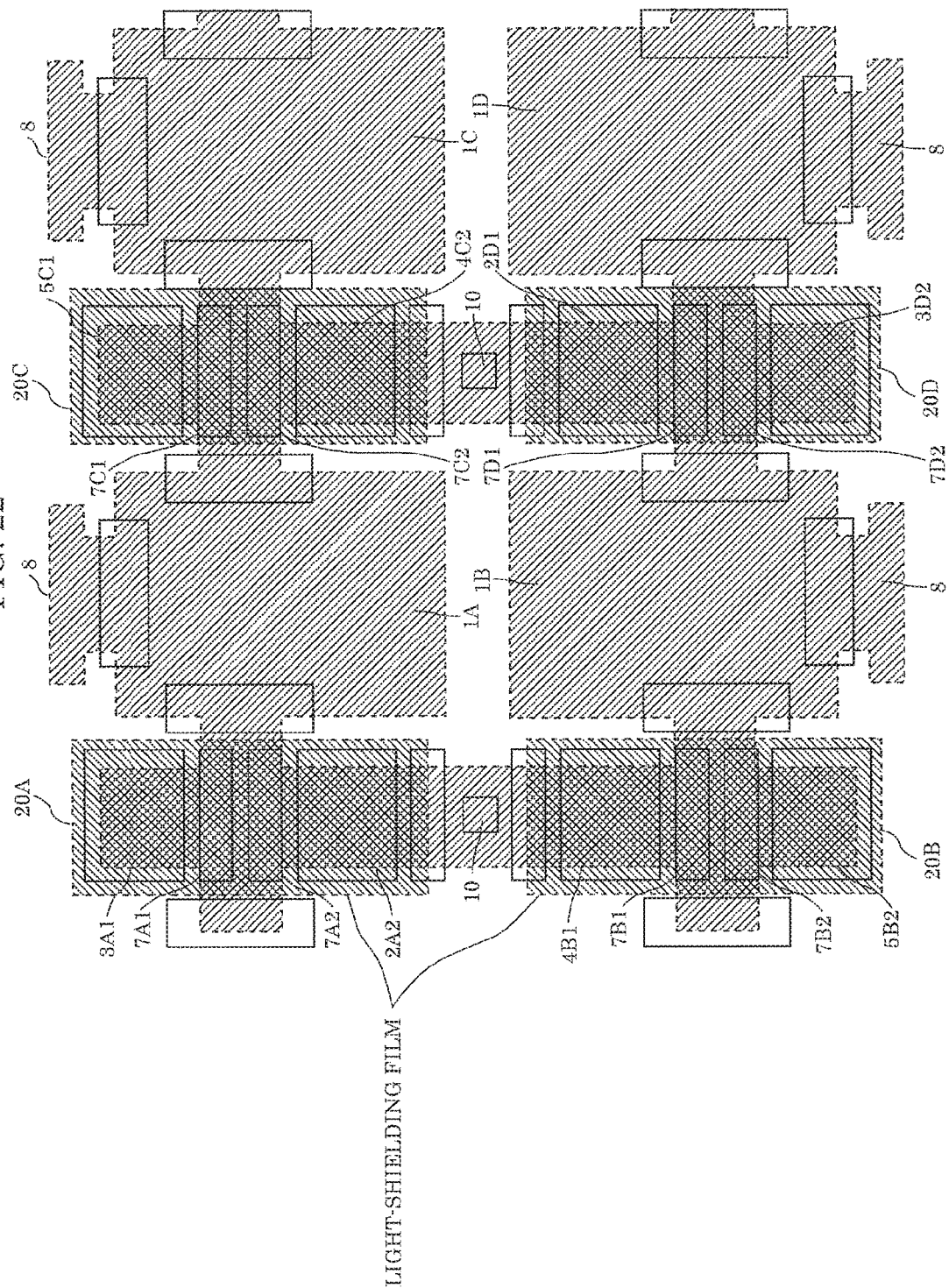
FIG. 22 is a schematic plan view illustrating a layout configuration of pixels of a solid-state imaging device according to Embodiment 4.

FIG. 22 is a schematic plan view illustrating a layout configuration of pixels of the solid-state imaging device according to Embodiment 4. The solid-state imaging device according to the present embodiment is different from solid-state imaging device 100 according to Embodiment 1 only in that light-shielding films 20A, 20B, 20C, and 20D are formed in the imaging region. In the solid-state imaging device according to the present embodiment, light-shielding film 20A is provided so as to cover charge accumulators 2A2 and 3A1 and distributors 7A1 and 7A2. Furthermore, light-shielding film 20B is provided so as to cover charge accumulators 4B1 and 5B2 and distributors 7B1 and 7B2. Furthermore, light-shielding film 20C is provided so as to cover charge accumulators 4C2 and 5C1 and distributors 7C1 and 7C2. Furthermore, light-shielding film 20D is provided so as to cover charge accumulators 2D1 and 3D2 and distributors 7C1 and 7C2.

With only a metal wiring layer as in a normal MOS process, even when upper wiring shields light, oblique incident light enters the charge accumulator and is photoelectrically converted, reducing the light resistance or leading to an increase in the background light component; thus, the distance accuracy is reduced.

In order to address this problem, in the solid-state imaging device according to the present embodiment, light-shielding films 20A to 20D are provided so as to cover the charge accumulator and the distributors and are disposed in a position lower than the wiring layer in the MOS process. Meanwhile, the light-shielding film is selectively not disposed on the gate of the exposure controller. With this, it is possible to reduce the increase in the parasitic capacitance of the exposure controller which is required to be driven at high speed.

As described above, with the solid-state imaging device according to Embodiment 4, the light-shielding properties of the charge accumulator and the distributor improve, and thus the light resistance can be improved, and furthermore, the background light component is suppressed; thus, the distance accuracy can be improved.

Embodiment 5

A solid-state imaging device and a method for driving the same according to Embodiment 5 will be described, focusing on differences from Embodiments 1 to 4.

Figure 23:
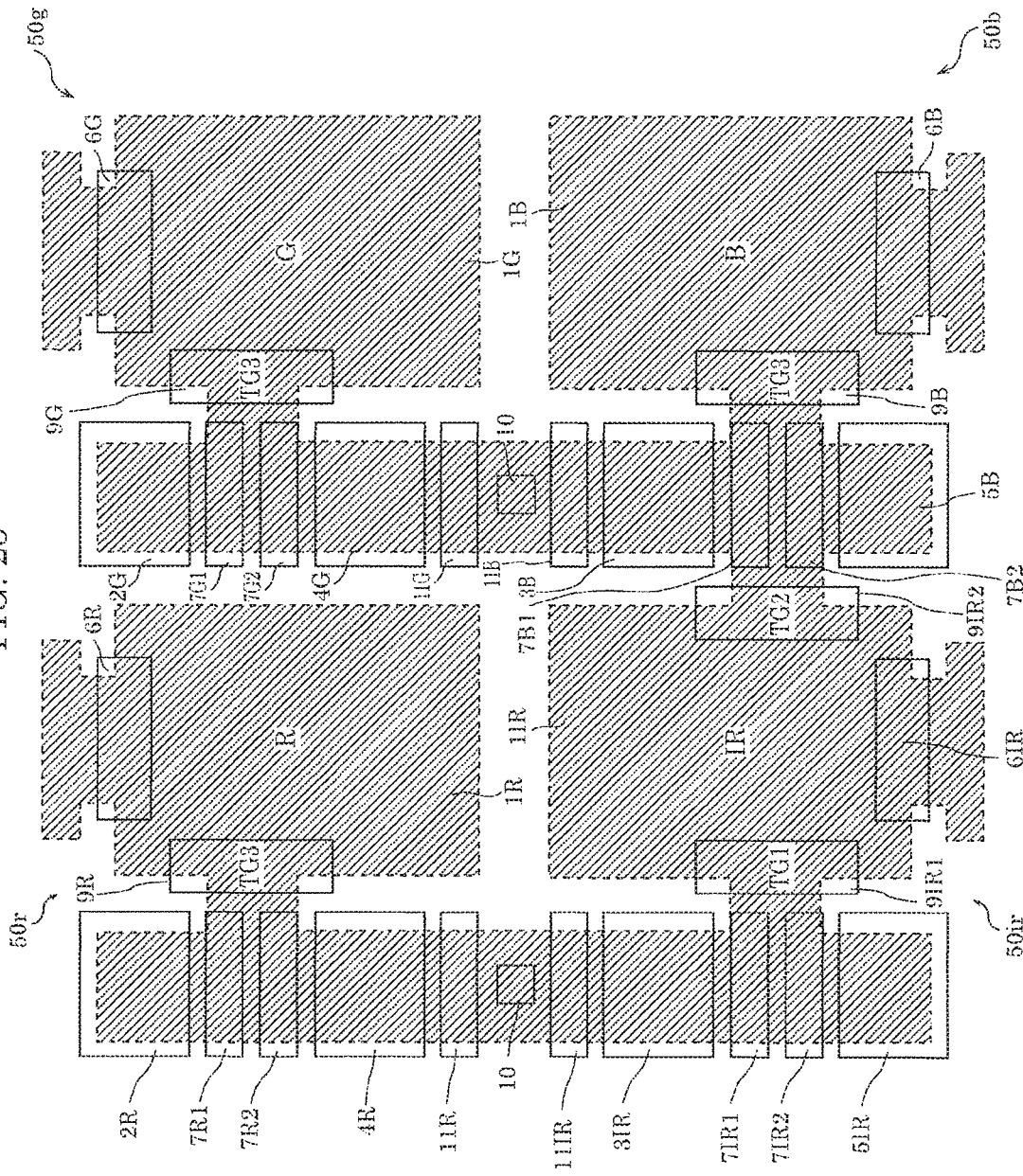
FIG. 23 is a schematic plan view illustrating a layout configuration of pixels of a solid-state imaging device according to Embodiment 5.
Figure 24:
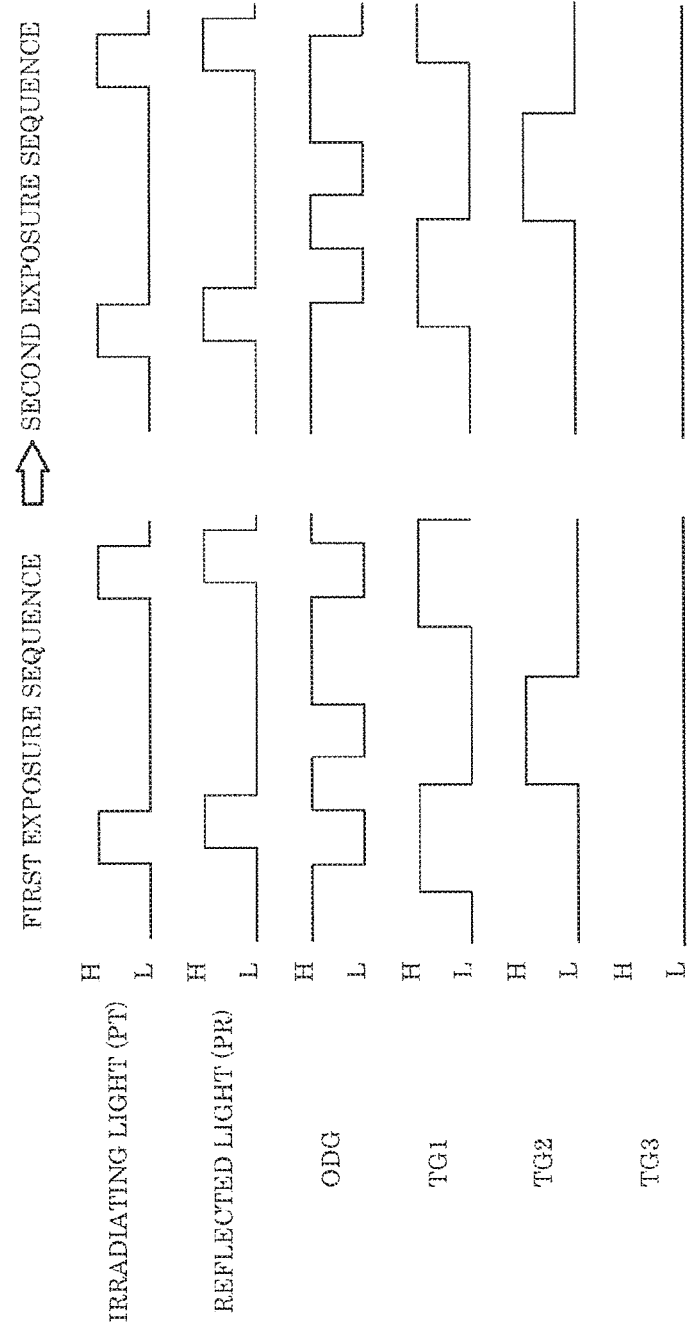
FIG. 24 is a drive timing chart illustrating operations of a solid-state imaging device according to Embodiment 5 during exposure.

FIG. 23 is a schematic plan view illustrating a layout configuration of pixels of the solid-state imaging device according to Embodiment 5, and FIG. 24 is a drive timing chart illustrating operations of the solid-state imaging device according to Embodiment 5 during exposure.

The solid-state imaging device included in the distance measurement imaging device according to the present embodiment includes a color filter, and as illustrated in FIG. 23, has an RGB-IR array to enable both color imaging and distance measurement using IR pixels. Unlike solid-state imaging device 100 according to Embodiment 1, the solid-state imaging device according to the present embodiment performs reading independently without addition of R, G, and B and adjacent pixels, and therefore additionally includes readers 9R, 9G, and 9B. In the case of reading the RGB-IR pixel independently, the gates of readers 9R, 9G, 9B, and 9IR1 are turned ON. As in Embodiment 1, two readers 9IR1 and 9IR2 are provided on pixel 50$ir$ (the first pixel), and during the TOF operation, drive pulse signals TG1 and TG2 for reading are applied to readers 9IR1 and 9IR2 so that four signals for distance calculation are obtained. Meanwhile, since a pixel adjacent to pixel 50$ir$ is not an IR pixel, the addition of signal charge is not performed, and the signals for distance calculation read from photoelectric converter 11R of pixel 50$ir$ are accumulated in a total of four charge accumulators 3IR, 5IR, 3B, and 5B disposed on both sides of photoelectric converter 11R. Furthermore, gates 9R, 9B, and 9G of the readers of the RGB pixels are OFF during the TOF operation, and therefore, in the pixel arrangement in FIG. 23, at the time of independent reading of the RGB-IR pixel, charge accumulators 3B and 5B of the B pixel (the third pixel) are used during the TOF operation.

As illustrated in FIG. 24, in the driving method according to the present embodiment, it is sufficient that one kind of exposure control drive pulse signals ODG be used, as in Embodiment 1. Furthermore, the exposure sequence is divided into two; in the first exposure sequence, two signals for distance calculation are read in a period in which drive pulse signals TG1 and TG2 are at the high level, and the read signals are respectively accumulated in charge accumulator 5IR and charge accumulator 5B. In the second exposure sequence, the exposure timing dependent on exposure control drive pulse signal ODG is delayed by the pulse width of irradiating light (PT), and in accordance with drive pulse signal ODG, two signals are read in a period in which drive pulse signals TG1 and TG2 are at the high level, and are respectively accumulated in charge accumulators 3IR and 3B. At the time of reading all the pixels, readers 9R, 9G, 9B, and 9IR1 are used; in the present structure, since there are two charge accumulators per pixel, it is also possible to perform a double-shutter operation in which two signals having different exposure periods are obtained.

Note that in the present embodiment, FD 10 is shared by two pixels, but one FD may be shared by four pixels. Since signal charge needs to be transferred individually from the gates of different charge accumulators to the shared FD, two more kinds of gates of charge accumulators are needed, compared to the case in which the FD is shared by two pixels, but it is possible to improve the distance measurement accuracy because sense capacitance is the same for four signals for distance calculation during the TOF operation.

Figure 25:
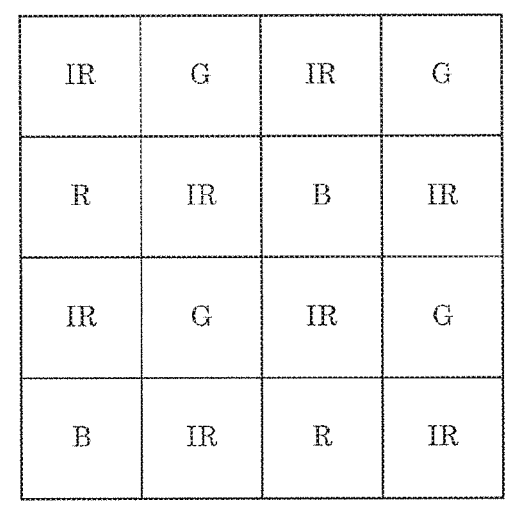
Figure 26:
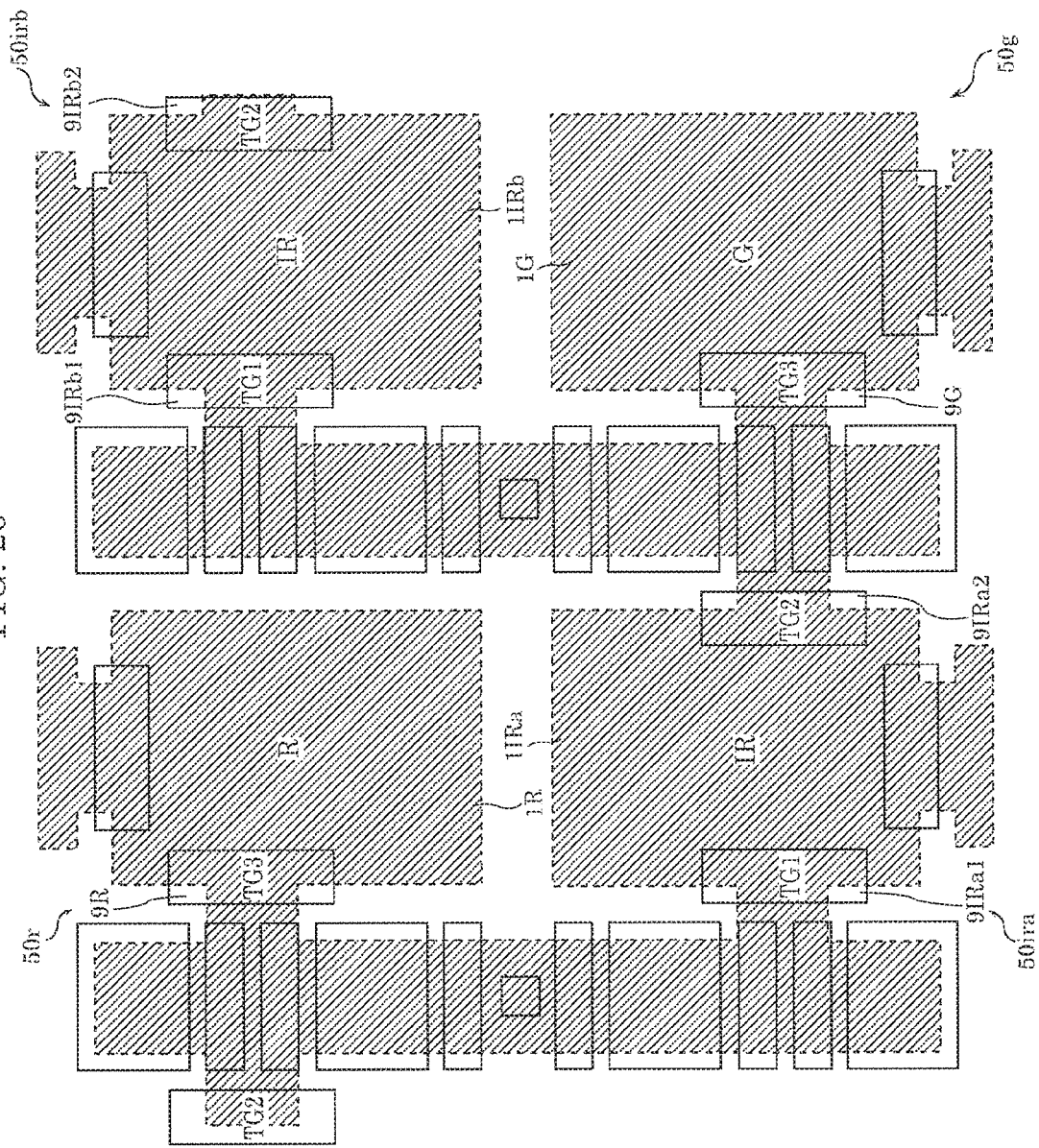
FIG. 26 illustrates a variation of the layout of pixels of a solid-state imaging device according to Embodiment 5.

FIG. 25 illustrates a variation of the pixel arrangement of the solid-state imaging device according to Embodiment 5. Furthermore, FIG. 26 illustrates a variation of the layout of pixels of the solid-state imaging device according to Embodiment 5. As illustrated in FIG. 26, the arrangement configuration of a pixel circuit according to the present embodiment can be applied to an RGB-IR array in which each unit has 4×4 pixels, such as that illustrated in FIG. 25. Note that the pixel arrangement according to the present variation is one example characterized in that the IR pixels are arranged in a checkered pattern in each unit of 4×4 pixels and account for the half of the total number of pixels. Also in this case, drive pulse signal TG3 is set to the low level during the TOF operation, and thus, the charge accumulator used by the RGB pixels can be used as a charge accumulator of the IR pixel at the time of RGB-IR reading. In the present variation, the number of IR pixels is twice as many as that in the case of FIG. 23, and thus, the resolution during the TOF can be set high. Furthermore, it is also possible to improve the distance accuracy by adding up the signals.

As described above, with the solid-state imaging device according to Embodiment 5, the TOF operation using four charge accumulators is possible even in the RGB-IR array, and thus both the distance measurement range and the distance measurement accuracy can be sufficient, and it is possible to obtain an RGB-IR image as well.

Other Embodiments

Although the solid-state imaging device and the method for driving the same according to the present disclosure have been described thus far based on the above embodiments, the solid-state imaging device and the method for driving the same according to the present disclosure are not limited to the embodiments described above. The present disclosure includes other embodiments implemented through a combination of arbitrary structural elements of the above embodiments, or variations obtained through the application of various modifications to the above embodiments that may be conceived by a person having ordinary skill in the art, without departing from the essence of the present disclosure, and various devices such as a distance measurement imaging device in which the solid-state imaging device according to the present disclosure is built-in.

Note that the solid-state imaging device according to the present disclosure obtains distance measurement signals using different pixels. Therefore, errors in distance measurement include (1) a difference in the number of sensitive electrons between pixels that is caused by production tolerance of on-chip lenses, aperture dimension, etc., and (2) a difference in amplifier gain that is caused by a difference in sense capacitance, etc. In this regard, when FD-shared positions are provided within the distance calculation range as illustrated in the checkered layout in FIG. 14A, FIG. 15, and FIG. 16, the abovementioned (2) can be solved, but the abovementioned (1) remains. This does not stand out in video because of variations in distance measurement that are caused by shot noise, but may become problematic when a shot noise reduction approach is used.

As a solution to this problem, more than one frame is obtained, the effect of shot noise is removed, sensitivity is averaged, and sensitivity ratio α f pixels within the distance calculation range is calculated and brought to a calculation device in advance (calibration is performed). Ideally, if $A2>A0$ and $A3>A1$, distance L satisfies $L \propto (A3-A1)/(A2+A3-A0-A1)$, but when the sensitivity ratio between pixels for obtaining A1 and A3 signals and pixels for obtaining A0 and A2 signals is $1:\alpha$ in a structure such as that described in the variation of Embodiment 1, $L \propto (A3-A1)/(\alpha A2+A3-\alpha A0-A1)$, which includes an error, as compared to an ideal case. Therefore, for example, α may be brought to the calculation process side in advance, and correction may be performed by multiplying $1/\alpha$ with the A0 and A2 signals before calculation of L.

It goes without saying that there are cases where both the abovementioned (1) and (2) are not problematic because they are dependent on the process and the design technique.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The distance measurement imaging device according to the present disclosure is small and enables three-dimensional measurement with high distance measurement accuracy and a wide distance measurement range, and is useful, for example, for three-dimensional measurement of persons, buildings, etc.

What is claimed is:
1. A solid-state imaging device comprising a plurality of pixels arranged in a matrix on a semiconductor substrate,
wherein each of the plurality of pixels includes:
a photoelectric converter which receives light from an object and converts the light into charge;
a plurality of readers which read the charge from the photoelectric converter;
a plurality of charge accumulators which accumulate the charge of the photoelectric converter; and
a transfer controller which performs a transfer control including controlling whether the charge is transferred or blocked from being transferred,
the plurality of readers read the charge of the photoelectric converter to the plurality of charge accumulators,
the plurality of pixels include at least a first pixel and a second pixel,
the transfer controller performs the transfer control to cause addition of the charge read from each of the first pixel and the second pixel, and
an exposure controller which switches between accumulation of the charge into the photoelectric converter and discharge of the charge from the photoelectric converter, the exposure controller including an overflow drain gate,
the solid-state imaging device further comprises a drive controller which controls driving of a drive pulse signal that is applied to (i) the overflow drain gate included in the exposure controller or (ii) a substrate having a vertical overflow drain (VOD) structure, and
a plurality of exposure control gate wires which are provided for each pixel row or each pixel column and through which the exposure control pulse signal is transmitted from the drive controller to the exposure controller, wherein the plurality of exposure control gate wires are disposed parallel to a short side of an imaging region on the semiconductor substrate, the imaging region being a region in which the plurality of pixels are arranged.

2. A solid-state imaging device comprising a plurality of pixels arranged in a matrix on a semiconductor substrate,
wherein each of the plurality of pixels includes:
a photoelectric converter which receives light from an object and converts the light into charge;
a plurality of readers which read the charge from the photoelectric converter;
a plurality of charge accumulators which accumulate the charge of the photoelectric converter; and
a transfer controller which performs a transfer control including controlling whether the charge is transferred or blocked from being transferred,
the plurality of readers read the charge of the photoelectric converter to the plurality of charge accumulators,
the plurality of pixels include at least a first pixel and a second pixel,
the transfer controller performs the transfer control to cause addition of the charge read from each of the first pixel and the second pixel, and
an exposure controller which switches between accumulation of the charge into the photoelectric converter and discharge of the charge from the photoelectric converter, the exposure controller including an overflow drain gate,
the solid-state imaging device further comprises a drive controller which controls driving of a drive pulse signal that is applied to (i) the overflow drain gate included in the exposure controller or (ii) a substrate having a vertical overflow drain (VOD) structure, and
a plurality of read gate wires which are provided for each pixel row or each pixel column and through which the drive pulse signal is transmitted from the drive controller to gate electrodes of the plurality of readers,
wherein a total number of times a read gate wire included in the plurality of read gate wires switches to a high level is different across the plurality of read gate wires.

3. A solid-state imaging device comprising a plurality of pixels arranged in a matrix on a semiconductor substrate,
wherein each of the plurality of pixels includes:
a photoelectric converter which receives light from an object and converts the light into charge;
a plurality of readers which read the charge from the photoelectric converter;
a plurality of charge accumulators which accumulate the charge of the photoelectric converter; and
a transfer controller which performs a transfer control including controlling whether the charge is transferred or blocked from being transferred,
the plurality of readers read the charge of the photoelectric converter to the plurality of charge accumulators,
the plurality of pixels include at least a first pixel and a second pixel,
the transfer controller performs the transfer control to cause addition of the charge read from each of the first pixel and the second pixel, and
an exposure controller which switches between accumulation of the charge into the photoelectric converter and discharge of the charge from the photoelectric converter, the exposure controller including an overflow drain gate,
the solid-state imaging device further comprises a drive controller which controls driving of a drive pulse signal that is applied to (i) the overflow drain gate included in the exposure controller or (ii) a substrate having a vertical overflow drain (VOD) structure, and
wherein the drive controller changes, according to an operation of the object, a total number of times a first exposure sequence and a second exposure sequence are sequentially repeated.

\* \* \* \* \*